US010950543B2

(12) United States Patent
Kuwabara et al.

(10) Patent No.: US 10,950,543 B2
(45) Date of Patent: Mar. 16, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shinichi Kuwabara, Ibaraki (JP); Yasutaka Nakashiba, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/408,023

(22) Filed: May 9, 2019

(65) Prior Publication Data
US 2019/0371727 A1 Dec. 5, 2019

(30) Foreign Application Priority Data

Jun. 4, 2018 (JP) .............................. JP2018-106790

(51) Int. Cl.
*H01L 23/522* (2006.01)
*H01L 21/768* (2006.01)
(Continued)

(52) U.S. Cl.
CPC ........ *H01L 23/5227* (2013.01); *H01L 21/743* (2013.01); *H01L 21/76802* (2013.01);
(Continued)

(58) Field of Classification Search
CPC ... H01L 23/5227; H01L 28/10; H01L 23/645; H01L 27/0688; H01L 27/1255;
(Continued)

(56) References Cited

U.S. PATENT DOCUMENTS 8,058,137 B1* 11/2011 Or-Bach .............. H03K 17/687
257/E21.023
8,378,470 B2 2/2013 Nakashiba et al.
(Continued)

FOREIGN PATENT DOCUMENTS

JP 2011-054800 A 3/2011

OTHER PUBLICATIONS

Gambino et al., "An Overview of Through-Silicon-Via Technology and Manufacturing Challenges", Microelectronic Engineering 135, Jan. 8, 2015 (Year: 2015).*

*Primary Examiner* — Selim U Ahmed
*Assistant Examiner* — Evan G Clinton
(74) *Attorney, Agent, or Firm* — McDermott Will & Emery LLP

(57) ABSTRACT

The semiconductor device includes a first semiconductor substrate, a first wiring layer, a second wiring layer, a second semiconductor substrate, a first conductive portion, and a second conductive portion. The first wiring layer includes a first electrode pad and a first inductor electrically connected with each other. The second wiring layer includes a second inductor and a second electrode pad electrically connected with each other. The first conductive portion is formed in the second semiconductor substrate, the second wiring layer, and the first wiring layer so as to reach the first electrode pad from the back surface of the second semiconductor substrate. The second conductive portion is formed in the second semiconductor substrate and the second wiring layer so as to reach the second electrode pad from the back surface of the second semiconductor substrate. The first inductor and the second inductor are disposed so as to face each other.

22 Claims, 22 Drawing Sheets

(51) Int. Cl.
*H01L 27/06* (2006.01)
*H01L 21/74* (2006.01)
*H01L 23/528* (2006.01)
*H01L 23/64* (2006.01)
*H01L 49/02* (2006.01)
*H01L 25/065* (2006.01)
H01L 27/02 (2006.01)

(52) U.S. Cl.
CPC ...... *H01L 21/76877* (2013.01); *H01L 23/528* (2013.01); *H01L 23/5226* (2013.01); *H01L 23/645* (2013.01); *H01L 25/0657* (2013.01); *H01L 27/0688* (2013.01); *H01L 28/10* (2013.01); *H01L 27/0288* (2013.01)

(58) Field of Classification Search
CPC ........... H01L 27/1259; H01L 21/76802; H01L 21/76877; H01L 25/0657; H01L 24/10–17; H01L 23/488–49894
See application file for complete search history.

(56) References Cited

U.S. PATENT DOCUMENTS

2014/0353839 A1* 12/2014 Lin ................. H01L 23/481
257/774
2015/0130022 A1* 5/2015 Watanabe ............... H01L 23/62
257/531
2019/0067253 A1* 2/2019 Nakano .................. H01L 24/83

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2018-106790 filed on Jun. 4, 2018 including the specification, drawings and abstract is incorporated herein by reference in its entirety.

BACKGROUND

The present invention relates to a semiconductor device and a method of manufacturing the same.

Conventionally, a semiconductor device described in Japanese Patent Application Laid-Open No. 2011-54800 has been known.

The semiconductor device described in Japanese Patent Application Laid-Open No. 2011-54800 includes a first semiconductor chip and a second semiconductor chip. The first semiconductor chip has a first multilayer wiring layer. A first inductor is formed inside the first multilayer wiring layer. The second semiconductor chip has a second multilayer wiring layer. A second inductor is formed inside the second multilayer wiring layer.

The first semiconductor chip and the second semiconductor chip are stacked so that the first multilayer wiring layer and the second multilayer wiring layer face each other. The first inductor and the second inductor are faced to each other in plan view.

The first semiconductor chip has a first non-facing region not facing the second semiconductor chip, and the second semiconductor chip has a second non-facing region not facing the first semiconductor chip. The first multilayer wiring layer has a first external connection terminal in the first non-facing region. The second multilayer wiring layer has a second external connection terminal in the second non-facing region.

In the semiconductor device described in Japanese Patent Application Laid-Open No. 2011-54800, the first external connection terminal and the second connection terminal are electrically connected with the lead frame through wire bonding. Since the first external connection terminal and the second external connection terminal are oriented in opposite directions with each other, in the semiconductor device described in Japanese Patent Application Laid-Open No. 2011-54800, a process for performing wire bonding is complicated.

Other objects and novel features will become apparent from the description of this specification and the accompanying drawings.

SUMMARY

The semiconductor device according to the embodiment includes a first semiconductor substrate, a first wiring layer formed on the first semiconductor substrate, a second wiring layer formed on the first wiring layer, a second semiconductor substrate formed on the second wiring layer, a first conductive portion and a second conductive portion. The first wiring layer includes a first electrode pad and a first inductor electrically connected with each other. The second wiring layer includes a second inductor and a second electrode pad electrically connected with each other.

The first conductive portion is formed in the second semiconductor substrate, the second wiring layer, and the first wiring layer such that the first conductive portion reaches the first electrode pad from the back surface of the second semiconductor substrate. The second conductive portion is formed in the second semiconductor substrate and the second wiring layer such that the second conductive portion reaches the second electrode pad from the back surface of the second semiconductor substrate. The first inductor and the second inductor are faced with each other.

According to the semiconductor device of the embodiment, it is possible to simplify the assembling process of the semiconductor device.

BRIEF DESCRIPTION OF THE DRAWINGS

DETAILED DESCRIPTION in the following drawings, the same or corresponding parts are denoted by the same reference numerals, and the description thereof will not be repeated. At least some of the embodiments described below may be arbitrarily combined.

(Configuration of a Semiconductor Device According to the First Embodiment)

A schematic configuration of a semiconductor device according to the first embodiment will be described below.

Figure 1:
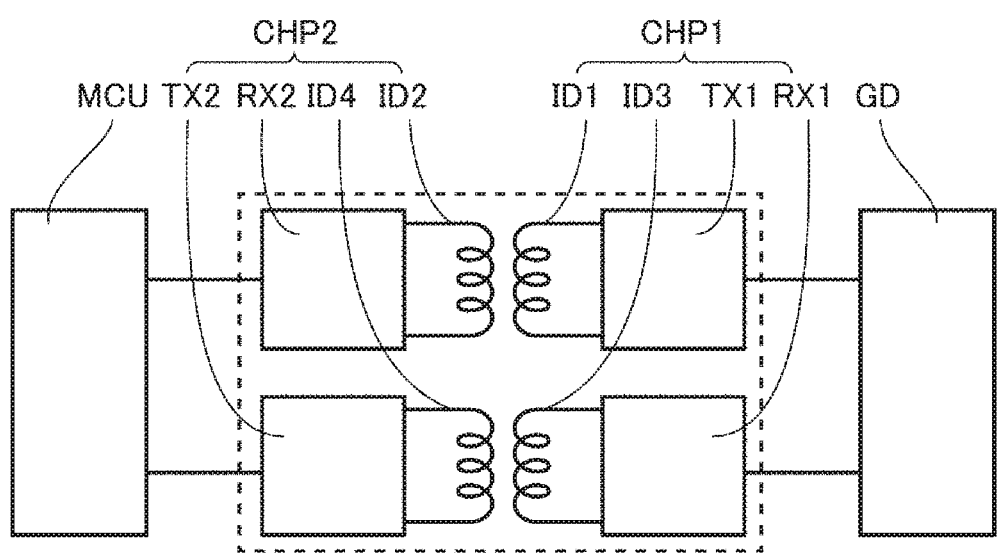
FIG. 1 is a schematic configuration diagram of a semiconductor device according to a first embodiment.

As shown in FIG. 1, the semiconductor device according to the first embodiment includes a first semiconductor chip CHP1 and a second semiconductor chin CHP2.

The first semiconductor chip CHP1 includes a transmitter circuit TX1, a receiver circuit RX1, a first inductor ID1 and a third inductor ID3. The second semiconductor chip CHP2 includes a transmitter circuit TX2, a receiver circuit RX2, a second inductor ID2 and a fourth inductor ID4.

The receiver circuit RX1 and the transmitter circuit TX1 are connected with, for example, a gate driver GD. The gate driver GD is connected with the power semiconductor device. The transmitter circuit TX1 and the receiver circuit RX1 are connected with the first inductor ID1 and the third inductor ID3, respectively. The receiver circuit RX2 and the transmitter circuit TX2 are, for example, connected with the microcontroller MCU. The transmitter circuit TX2 and the receiver circuit RX2 are connected with the fourth inductor ID4 and the second inductor ID2, respectively. The first inductor ID1 and the second inductor ID2 are formed at a position where they can be inductively coupled with each other, and the third inductor ID3 and the fourth inductor ID4 are formed at a position where they can be inductively coupled with each other. As a result, no current flows between the first semiconductor chip CHP1 and the second semiconductor chip CHP2, but signals are transmitted and received.

The signal from the gate driver GD is transmitted to the microcontroller MCU via the transmitter circuit TX1, the first inductor ID1, the second inductor ID2 and the receiver circuit RX2. The signal from the microcontroller MCU is transmitted to the gate driver GD via the transmitter circuit TX2, the fourth inductor ID4, the third inductor ID3 and the receiver circuit RX2. That is, the semiconductor device according to the first embodiment is a digital isolator that enables transmission and reception of signals while isolating between a semiconductor device operating by a relatively low voltage (in the above example, the microcontroller MCU) and a semiconductor device operating by a relatively high voltage (in the above example, the gate driver GD).

Figure 2:
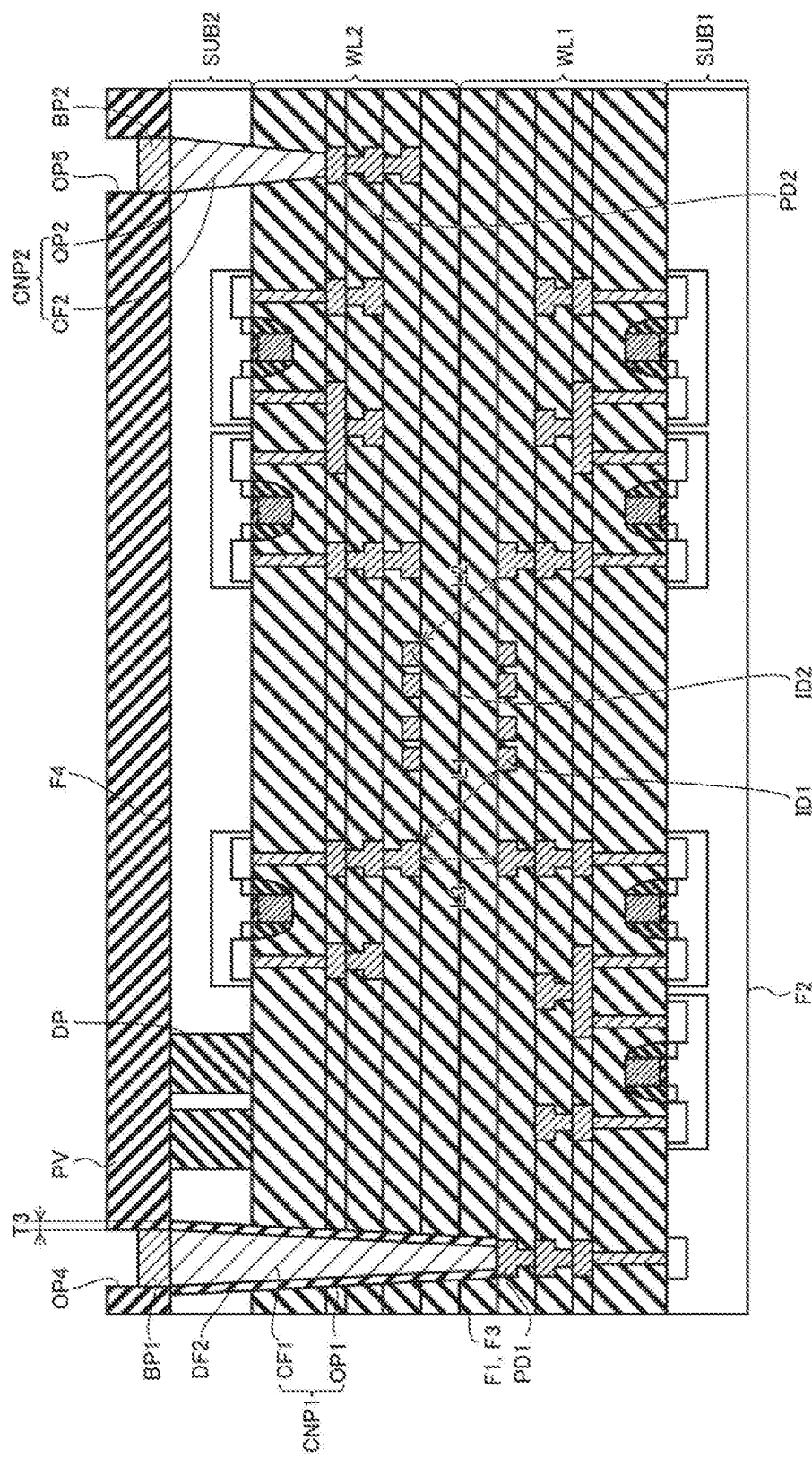
FIG. 2 is a cross-sectional view of a semiconductor device according to a first embodiment.

Hereinafter, a detailed configuration of the semiconductor device according to the first embodiment will be described. As shown in FIG. 2, the first semiconductor chip CHP1 has a first surface F1 and a second surface F2. The second surface F2 is an opposite surface of the first surface F1. The second semiconductor chip CHP2 has third surface F3 and a fourth surface F4. The fourth surface F4 is an opposite surface of the third surface F3.

Figure 3:
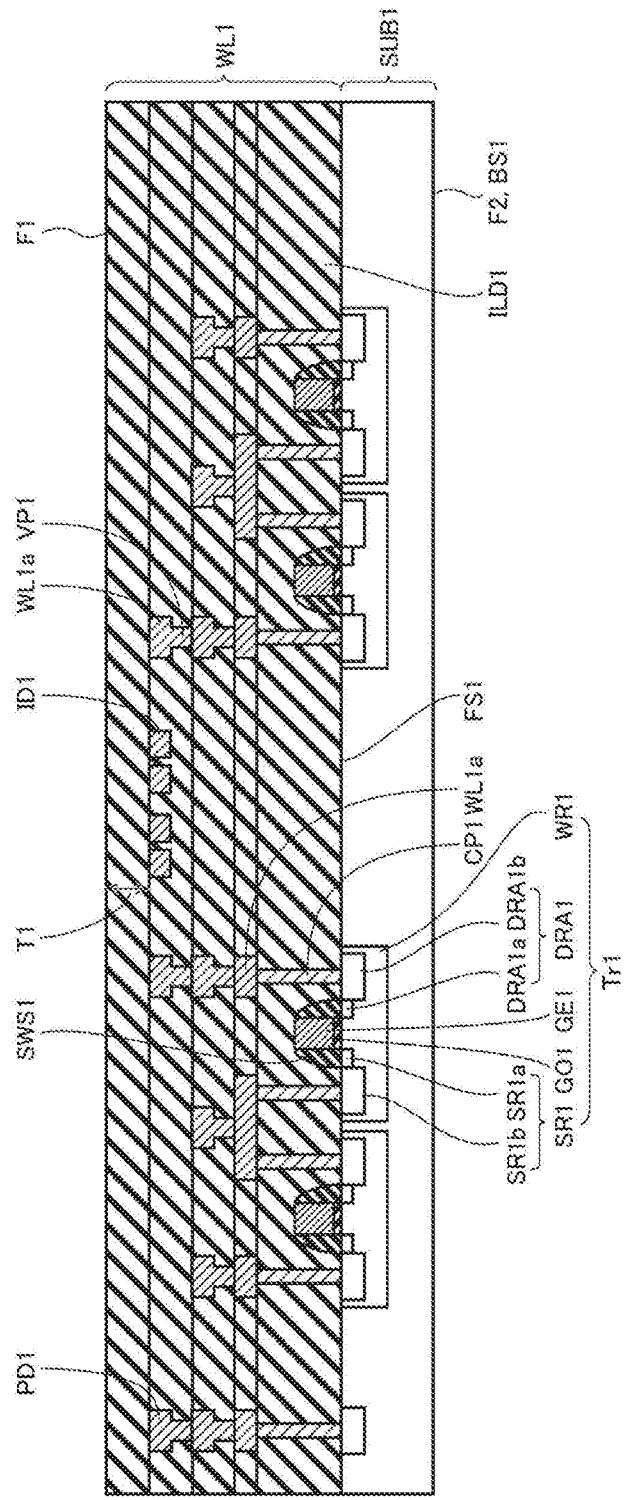
FIG. 3 is a cross-sectional view of a first semiconductor chip CHP1 in a semiconductor device according to a first embodiment.

As shown in FIG. 3, the first semiconductor chip CHP1 includes a first semiconductor substrate SUB1, a gate insulating film GO1, a gate electrode GE1, a sidewall spacer SWS1 and a first wiring layer WL1. The first wiring layer WL1 includes a first inductor ID1 and a first electrode pad PD1. The first semiconductor board SUB1 is disposed on the second surface F2 of the first semiconductor chip CHP1. The first wiring layer WL1 is formed on the first surface F1 of the first semiconductor chip CHP1. In this specification, the term "electrode pad (the first electrode pad PD1 and a second electrode pad PD2)" means a wiring connected with a conductive portion other than the wiring among the wirings in the wiring layer.

The first semiconductor substrate SUB1 has a front surface FS1 and a back surface BS1. The back surface BS1 is an opposite surface to the front surface FS1. The front surface FS1 and the back surface BS1 constitute a main surface of the first semiconductor substrate SUB1. The first semiconductor substrate SUB1 is comprised of, for example, single-crystal silicon (Si). A source region SR1, a drain region DRA1 and a well region WR1 are formed in the first semiconductor substrate SUB1.

The source region SR1 and the drain region DRA1 are formed on the front surface FS1. The well region WR1 is formed on the front face FS1 such that the well region WR1 surrounds the source region SR1 and the drain region DRA1. The well region WR1 has a portion sandwiched between the source region SR1 and the drain region DRA1. The part of the well region WR1 sandwiched between the source region SR1 and the drain region DRA1 is referred to as a channel region.

The conductivity types of the source region SR1 and the drain region DRA1 are the first conductivity type. The conductivity type of the well region WR1 is the second conductivity type. The second conductivity type is the opposite conductivity type of the first conductivity type. For example, when the first conductivity type is n-type, the second conductivity type is p-type.

The source region SR1 includes a first portion SR1a and a second portion SR1b. The first portion SR1a is located closer to the drain region DRA1 than the second portion SR1b. The impurity concentration in the first portion SR1a is lower than the impurity concentration in the second portion SR1b. That is, the source region SR1 has a Lightly Doped Diffusion (LDD) structure. The drain region DRA1 has a first portion DRA1a and a second portion DRA1b. The first portion DRA1a is located closer to the source region SR1 than the second portion DRA1b. The impurity concentration in the first portion DRA1a is lower than the impurity concentration in the second portion DRA1b. That is, the drain region DRA1 has an LDD-structure.

The gate insulating film GO1 is formed on the surface FS1. More specifically, the gate insulating film GO1 is formed on the well region WR1 sandwiched between the source region SR1 and the drain region DRA1. The gate insulating film GO1 is comprised of, for example, a silicon oxide ($SiO_2$).

The gate electrode GE1 is formed on the gate insulating film GO1. That is, the gate electrode GE1 faces the well region WR1 (channel region) sandwiched between the source region SR1 and the drain region DRA1 while being insulated by the gate insulating film GO1. The gate electrode GE1 is comprised of, for example, polycrystalline silicon doped with an impurity.

The sidewall spacers SWS1 are formed on the front surfaces FS1 on the sides of the gate electrodes GE1. That is, the sidewall spacers SWS1 are formed on the first portion SR1a and the first portion DRA1a. The sidewall spacer SWS1 is comprised of, for example, silicon nitride ($Si_3N_4$).

The source region SR1, the drain region DRA1, the well region WR1, the gate insulating film GO1, and the gate electrodes GE1 constitute a transistor Tr1. The transistor Tr1 is a transistor constituting the transmission circuit TX1 and the reception circuit RX1.

The first interconnection layer WL1 are formed on the first semiconductor substrate SUB1. More specifically, the first wiring layer WL1 is formed on the front surface FS1. The first wiring layer WL1 includes a wiring WL1a, an interlayer insulating film ILD1, a contact plug CP1, and a via plug VP1. That is, the first wiring layer WL1 includes an interlayer insulating film ILD1 stacked in a direction crossing the front surface FS1, a wiring WL1a formed in the interlayer insulating film ILD1, a via plug VP1, a contact plug CP1, a first electrode pad PD1, and a first inductor ID1.

The contact plugs CP1 are formed in the interlayer insulating film ILD1 located closest to the front surface FS1, that is, directly above the front surface FS1. The contact plugs CP1 are electrically connected to the source regions SR1, the drain regions DRA1, and the gate electrodes GE1, respectively.

The wiring WL1a closest to the front face FS1 is electrically connected with the contact plug CP1. The wiring WL1a other than the wiring WL1a closest to the front face FS1 is electrically connected with each other through the via plug VP1.

Only the interlayer insulating film ILD1 is disposed between the first surface F1 and the first inductor ID1. That is, the wiring WL1a is not disposed between the first surface F1 and the first inductor ID1. The thickness of the interlayer insulating film ILD1 between the first surface F1 and the first inductor ID1 is the thickness T1. Although not shown, the first inductor ID1 has a spiral shape in plan view. The first inductor ID1 is ultimately electrically connected with the transistor Tr1.

The first electrode pad PD1 is electrically connected, for example, with the contact plug CP1, the wiring WL1a, and the via plug VP1 connected with each other along a direction intersecting with the front surface FS1 (the first surface F1 and the second surface F2). The first electrode pad PD1 is ultimately electrically connected with the transistor Tr1. Therefore, the first electrode pad PD1 and the first inductor ID1 are electrically connected with each other.

The wiring WL1a and the first inductor ID1 are made of copper or copper alloys, for example. The interlayer insulating film ILD1 is comprised of, for example, silicon oxide. The contact plug CP1 is comprised of, for example, tungsten (W). The via plug VP1 is comprised of, for example, copper or a copper alloy. The via plug VP1 may be formed integrally with the wiring WL1a.

Figure 4:
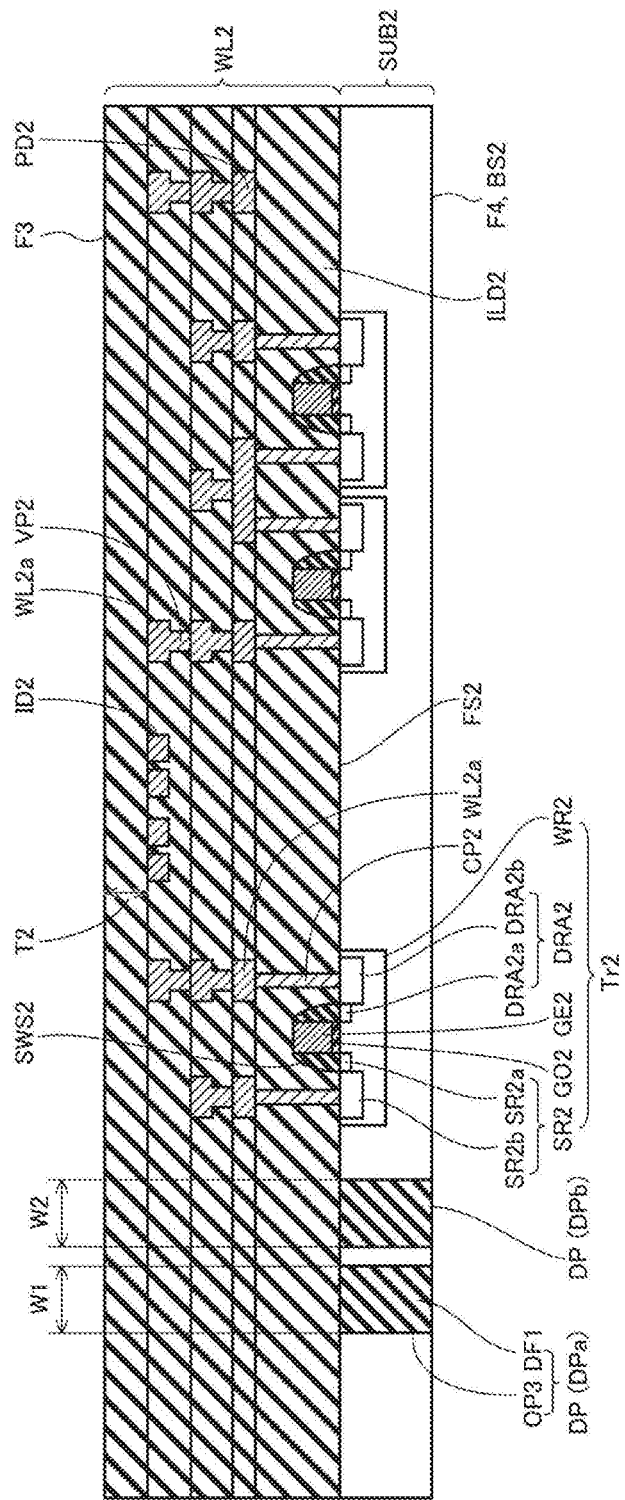
FIG. 4 is a cross-sectional view of a second semiconductor chip CHP2 in the semiconductor device according to the first embodiment.

As shown in FIG. 4, the second semiconductor chip CHP2 include a second semiconductor substrates SUB2, a gate insulating film GO2, a gate electrodes GE2, and a second wiring layer WL2. The second wiring layer WL 2 includes the second inductor ID2 and the second electrode pad PD2. The second semiconductor substrate SUB2 is disposed on the fourth surface F4 of the second semiconductor chips CHP2. The second wiring layer WL 2 is formed on the third surface F3 of the second semiconductor chip CHP2.

The second semiconductor substrate SUB2 has a front surface FS2 and a back surface BS2. The back surface BS2 is an opposite surface to the front surface FS2. The front surface FS2 and the back surface BS2 constitute a main surface of the second semiconductor substrate SUB2. The second semiconductor substrate SUB2 is comprised of, for example, single-crystal silicon. A source region SR2, a drain region DRA2, and a well region WR2 are formed in the second semiconductor substrate SUB2.

The source region SR2 and the drain region DRA2 are formed on the front surface FS2. The well region WR2 is formed on the front face FS2 such that the well region WR2 surrounds the source region SR2 and the drain region DRA2. The well region WR2 has a portion sandwiched between the source region SR2 and the drain region DRA2. The part of the well region WR2 sandwiched between the source region SR2 and the drain region DRA2 is referred to as a channel region.

The conductivity types of the source region SR2 and the drain region DRA2 are the first conductivity type. The conductivity type of the well region WR2 is the second conductivity type. The second conductivity type is the opposite conductivity type of the first conductivity type. For example, when the first conductivity type is n-type, the second conductivity type is p-type.

The source region SR2 includes a first portion SR2a and a second portion SR2b. The first portion SR2a is located closer to the drain region DRA2 than the second portion SR2b. The impurity concentration in the first portion SR2a is lower than the impurity concentration in the second portion SR2b. That is, the source region SR2 has an LDD structure. The drain region DRA2 has a first portion DRA2a and a second portion DRA2b. The first portion DRA2a is located closer to the source region SR2 than the second portion DRA2b. The impurity concentration in the first portion DRA2a is lower than the impurity concentration in the second portion DRA2b. That is, the drain region DRA2 has an LDD-structure.

The gate insulating film GO2 is formed on the surface FS2. More specifically, the gate insulating film GO2 is formed on the well region WR2 sandwiched between the source region SR2 and the drain region DRA2. The gate insulating film GO2 is comprised of, for example, silicon oxide.

The gate electrode GE2 is formed on the gate insulating film GO2. That is, the gate electrodes GE2 are faced to the well regions WR2 sandwiched between the source regions SR2 and the drain regions DRA2 while being insulated by the gate insulating films GO2. The gate electrode GE2 is comprised of, for example, polycrystalline silicon doped with an impurity.

The sidewall spacers SWS2 are formed on the front surfaces FS 2 on the sides of the gate electrodes GE 2. That is, the sidewall spacers SWS2 are formed on the first portion SR2a and the first portion DRA2a. The sidewall spacer SWS2 is comprised of, for example, silicon nitride.

The source region SR2, the drain region DRA2, the well region WR2, the gate insulating film GO2, and the gate electrodes GE2 constitute a transistor Tr2. This transistor constitutes the transmission circuit TX2 and the reception circuit RX2.

The insulating portion DP may be formed in the second semiconductor substrate SUB2. The insulating portion DP is comprised of an opening OP3 and a first insulating film DF1 buried in the opening OP3. The insulating portion DP insulates and separates the first conductive film CF1 from the impurity diffusion regions (the source region SR2, the drain region DRA2, and the well region WR2) constituting the transistor Tr2.

That is, as shown in FIG. 2, the insulating portion DP1 is formed between a portion of the second semiconductor substrate SUB2 where the impurity diffusion regions constituting the transistor Tr2 are arranged and a portion of the second semiconductor substrate SUB2 where the opening OP1 is arranged. A bottom surface of the first insulating film DF1 may be exposed from the back surface BS2. The first insulating film DF1 is comprised of, for example, silicon oxide. One insulating portion DP may be formed or a plurality of insulating portions DP may be formed.

Preferably, the width of the insulating portion DP (the width of the first insulating film DF1) is equal to or greater than the total of the thicknesses T1 and T2. Here, the width of the insulating portion DP is a distance between portions (facing surfaces) separated from each other by the insulating portion DP in the second semiconductor substrate SUB2. The thickness T1 is a distance between an upper surface of the first inductor ID1 and an upper surface (the first surface F1) of the first wiring layer WL1. The thickness T2 is a distance between an upper surface of the second inductor ID2 and an upper surface (the third surface F3) of the second wiring layer WL2. The width of the insulating portion DP is preferably equal to or greater than a distance between the first inductor ID1 and the second inductor ID2. When the number of the insulating portions DP is plural, the term "the width of the insulating portion DP is equal to or greater than the distance between the first inductor ID1 and the second inductor ID2" means that the total width of the insulating portion DP is equal to or greater than the distance between the first inductor ID1 and the second inductor ID2.

A depth of the insulating portion DP may be any depth as long as the insulating portion DP can insulate and separate the portion of the second semiconductor substrate SUB2 including the impurity diffusion region from the portion including the opening OP1 of the second semiconductor substrate SUB2. The insulating portion DP is preferably formed to be deeper than a depth of the Shallow Trench Isolation (STI) formed in the second semiconductor substrate SUB2. This STI is not shown. The insulating portion DP is preferably formed such that the insulating portion DP penetrates the second semiconductor substrate SUB2.

A shape of the insulating portion DP may be any shape as long as the insulating portion DP can insulate and separate the portion of the second semiconductor substrate SUB2 including the impurity diffusion region from the portion including the opening OP1 of the second semiconductor substrate SUB2. For example, the insulating portion DP may be formed such that the insulating portion DP surrounds the opening OP1 in plan view, or the insulating portion DP may be formed such that the insulating portion DP surrounds a portion of the second semiconductor substrate SUB2 including the impurity diffusion region.

In the example of FIG. 4, the insulating portions DP are formed at two places (these are referred to as an insulating portion DPa and an insulating portion DPb in order from the side closer to the first conductive film CF1). Assuming that the widths of the insulating portion DPa and the insulating portion DPb are the width W1 and the width W2, respectively, the total of the width W1 and the width W2 is equal to or greater than the distance between the first inductor ID1 and the second inductor ID2 (the sum of the thickness T1 and the thickness T2).

Figure 5:
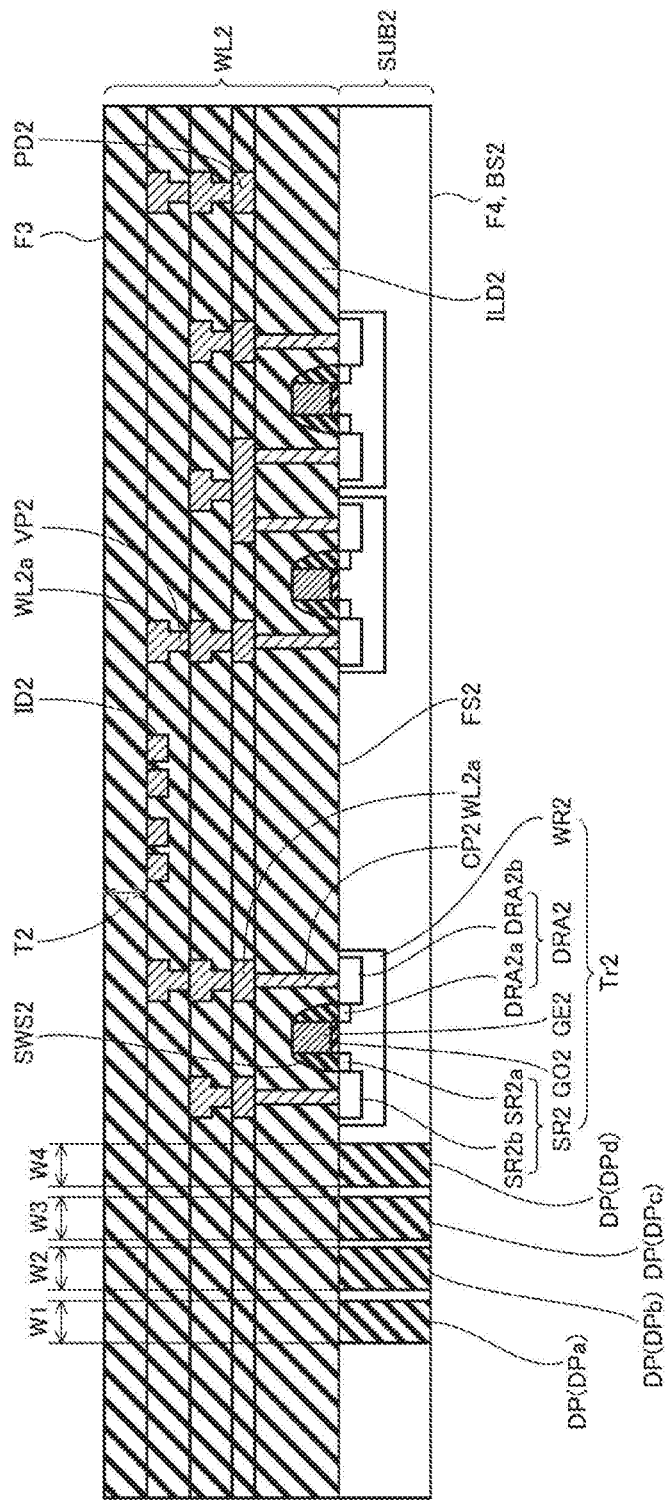
FIG. 5 is a cross-sectional view of r second semiconductor chip CHP2 of a semiconductor device according to a modification of the first embodiment.

In the example of FIG. 5, the insulating portions DP are formed in four places (these are referred to as an insulating portion DPa, an insulating portion DPb, an insulating portion DPc, and an insulating portion DPd in order from the side closer to the first conductive film CF1). Assuming that the width of the insulating portion DPa, the insulating portion DPb, the insulating portion DPc, and the insulating portion DPd are the width W1, the width W2, the width W3, and the width W4, respectively, the total of the widths W1 to W4 is preferably equal to or greater than the distance between the first inductor ID1 and the second inductor ID2 (the total of the thickness T1 and the thickness T2). As a result, the coupling constants of the first inductor ID1 and the second inductor ID2 can be increased while ensuring the dielectric breakdown voltage between the portion including the impurity diffusion region of the second semiconductor substrate SUB2 and the portion including the opening OP1 of the second semiconductor substrate SUB2.

The second wiring layer WL2 is formed on the second semiconductor substrate SUB2. More specifically, the second wiring layer WL2 is formed on the front surface FS2. In other words, as shown in FIG. 2, when the first semiconductor chip CHP1 and the second semiconductor chip CHP2 are laminated with each other, the second semiconductor substrate SUB2 is formed on the second wiring layer WL2. The second wiring layer WL2 further includes a wiring WL2a, an interlayer insulating film ILD2, a contact plug CP2, and a via plug VP2. That is, the second wiring layer WL2 includes an interlayer insulating film ILD2 stacked in a direction intersecting with the front surface FS2, a wiring WL2a formed in the interlayer insulating film ILD2, a via plug VP2, a contact plug CP2, a second electrode pad PD2, and a second inductor ID2.

The contact plugs CP2 are formed in the interlayer insulating film ILD2 located closest to the front surface FS2, that is, directly above the front surface FS2. The contact plugs CP2 are electrically connected with the source regions SR2, the drain regions DRA2, and the gate electrodes GE2, respectively.

The wiring WL2a closest to the front face FS2 is electrically connected with the contact plugs CP2. The wiring WL2a other than the wiring WL2a closest to the front face FS2 is electrically connected with each other through the via plug VP2.

Only the interlayer insulating film ILD2 is disposed between the third surface F3 and the second inductor ID2. That is, the wiring WL2a is not disposed between the third surface F3 and the second inductor ID2. The thickness of the interlayer insulating film ILD2 between the third surface F3 and the second inductor ID2 is the thickness T2. The total of the thickness T1 and the thickness T2 is set so that the interlayer insulating film ILD1 and the interlayer insulating film ILD2 between the first inductor ID1 and the second inductor ID2 are not dielectric breakdown when the potential difference between the first inductor ID1 and the second inductor ID2 is maximized. Although not shown, the second inductor ID2 has a spiral shape in plan view. The second inductor ID2 is ultimately electrically connected with the transistor Tr2.

The second electrode pad PD2 is electrically connected with the wiring WL2a and the via plug VP2, which are connected with each other along direction intersecting with the front surface FS2, for example, the third surface F3 and the fourth surface F4. The second electrode pad PD2 is ultimately electrically connected with the transistor Tr2. Therefore, the second electrode pad PD2 and the second inductor ID2 are electrically connected with each other.

The wiring WL2a and the second inductor ID2 are comprised of, for example, copper or copper alloys. The interlayer insulating film ILD2 is comprised of, for example, silicon oxide. The contact plug CP2 is comprised of, for example, tungsten. The via plug VP2 is comprised of, for example, copper or a copper alloy. The via plug VP2 may be formed integrally with the wiring WL2a.

As shown in FIG. 2, the first semiconductor chip CHP1 and the second semiconductor chip CHP2 are disposed such that the first semiconductor chip CHP1 and the second semiconductor chip CHP2 overlap with each other so that the first surface F1 and the third surface F3 face with each other. The first surface F1 and the third surface F3 are laminated with each other. That is, the first wiring layer WL1 and the second wiring layer WL2 are laminated with each other.

The semiconductor device according to the first embodiment further includes a first conductive portion CNP1 and a second conductive portion CNP2. The first conductive portion CNP1 is formed in the first wiring layer WL1, the second wiring layer WL2, and the second semiconductor substrate SUB2 such that the first conductive portion CNP1 extends from the fourth surface F4 to the first electrode pad PD1. The second conductive portion CNP2 is formed in the second wiring layer WL2 and the second semiconductor substrate SUB2 such that the second conductive portion CNP2 reaches the second electrode pad PD2 from the fourth surface F4 (the back surface BS2). The first conductive portion CNP1 has an opening OP1 and a first conductive film CF1. The second conductive portion CNP2 has an opening OP2 and a second conductive film CF2.

The opening OP1 extends from the fourth surface F4 (the back surface BS2) to the first electrode pad PD1. More specifically, the opening OP1 passes through the second semiconductor substrate SUB2 and the second wiring layer WL2 and is formed in the first wiring layer WL1 such that the opening OP1 reaches the first electrode pad PD1.

The opening OP2 extends from the fourth surface F4 (the back surface BS2) to the second electrode pad PD2. More specifically, the opening OP2 is formed in the second wiring layer WL 2 such that the opening OP2 penetrates the second semiconductor substrate SUB2 and reaches the second electrode pad PD2.

The second insulating film DF2 is formed on the inner surface of the opening OP1. The second insulating film DF2 is comprised of, for example, silicon oxide. The second insulating film DF2 has a thickness T3. The thickness T3 is preferably equal to or greater than the distance between the first inductor ID1 and the second inductor ID2, i.e., the total of the thickness T1 and the thickness T2, when the insulating portion DP is not formed in the second semiconductor substrate SUB2.

The first conductive film CF1 is formed on the second insulating film DF2 such that the first conductive film CF1 fills the opening OP1. The first conductive film CF1 is electrically connected to the first electrode pad PD 1. The first conductive film CF 1 is comprised of, for example, copper or a copper alloy.

The opening OP2 is buried with the second conductive film CF2. The second conductive film CF2 is electrically connected with the second electrode pad PD2. The second conductive film CF2 is comprised of, for example, copper or a copper alloy.

The first bonding pad BP1 and the second bonding pad BP2 are formed on the fourth surface F4 (the back surface BS2). The first bonding pad BP1 is electrically connected with the first conductive film CF1, and the second bonding pad BP2 is electrically connected with the second conductive film CF2.

The first bonding pad BP1 and the second bonding pad BP2 are comprised of, for example, aluminum, an aluminum, alloy, or the like. Wire bonding or the like is performed on the first bonding pad BP1 and the second bonding pad BP2, whereby electrical connection to the outside of the semiconductor device is performed.

A passivation film PV is formed on the fourth surface F4 (the back surface BS2). Openings OP4 and OP5 are formed in the passivation film PV. The first bonding pad BP1 and the second bonding pad BP2 are exposed in the opening OP4 and the opening OP5, respectively. The passivation film PV is comprised of, for example, silicon nitride.

Although the third inductor ID3 formed in the first wiring layer WL1 and the fourth inductor ID4 formed in the second wiring layer WL2 are not illustrated in the above description, the third inductor ID3 and the fourth inductor ID4 have the same structures as the first inductor ID1 and the second inductor ID2, respectively.

The interval between the first inductor ID1 and the second inductor ID2 (i.e., the total of the thickness T1 and the thickness T2), the distance L1 between the first inductor ID1 and the wiring WL2a, the distance L2 between the second inductor ID2 and the wiring WL1a, and the distance L3 between the wiring WL1a and the wiring WL2a are not particularly limited as long as the withstand voltage between the first semiconductor chip CHP1 and the second semiconductor chip CHP2 can be secured. The thickness T1, the thickness 12, the distance L1, the distance L2, and the distance L3 can be adjusted as appropriate according to the application of the semiconductor device.

In the above, it is preferable that the interval between the first inductor ID1 and the second inductor ID2 (the total of the thickness T1 and the thickness T2) is smaller than the distance L1 between the first inductor ID1 and the wiring WL2a, the distance L2 between the second inductor ID2 and the wiring WL1a, and the distance L3 between the wiring WL1a and the wiring WL2a. When at least one of the distance L1 between the first inductor ID1 and the wiring WL2a, the distance L2 between the second inductor ID2 and the wiring WL1a, and the distance L3 between the wiring WL1a and the wiring WL2a is smaller than the distance between the first inductor ID1 and the second inductor ID2 (the total of the thickness T1 and the thickness T2), the width (or the thickness T3) of the insulating portion DP is determined to be greater than the shortest distance among these distances. For example, when the required breakdown voltage is 2000 V or more, the total of the thickness T1 and the thickness T2 is preferably 5 μm or more and 30 μm or less, for example.

(A Method of Manufacturing a Semiconductor Device According to the First Embodiment)

Hereinafter, a method of manufacturing a semiconductor device according the first embodiment will be described.

Figure 6:
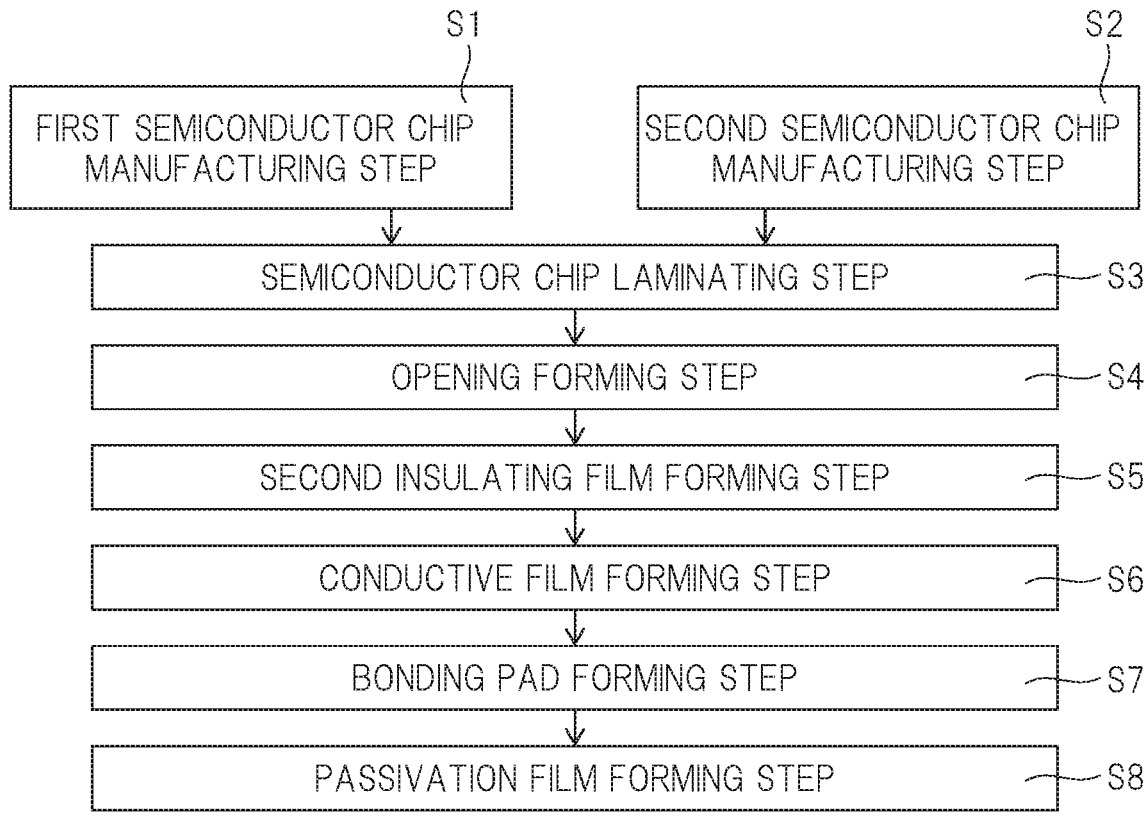
FIG. 6 is a process diagram illustrating a method of manufacturing a semiconductor device according to a first embodiment.

As shown in FIG. 6, the method of manufacturing a semiconductor device according to the first embodiment includes a first semiconductor chip manufacturing step S1, a second semiconductor chip manufacturing step S2, a semiconductor chip laminating step S3, an opening forming step S4, a second insulating film forming step S5, a conductive film forming step S6, a bonding pad forming step S7, and a pass nation film forming step S8.

Figure 7:
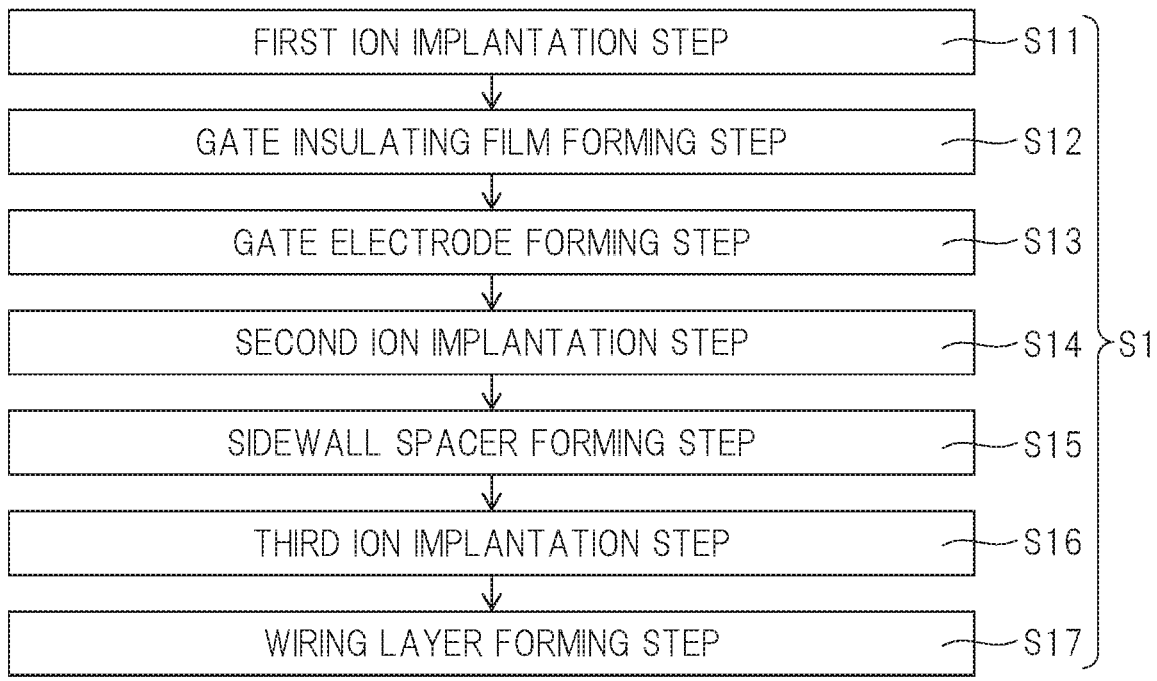
FIG. 7 is a process diagram illustrating a detail of a first semiconductor chip manufacturing step S1 according to a method of manufacturing a semiconductor device according to a first embodiment.

As shown in FIG. 7, the first semiconductor chip manufacturing step S includes a first ion implantation step S11, a gate insulating film forming step S12, a gate electrode forming step S13, a second ion implantation step S14, a sidewall spacer forming step S15, a third ion implantation step S16, and a wiring layer forming step S17.

Figure 8:
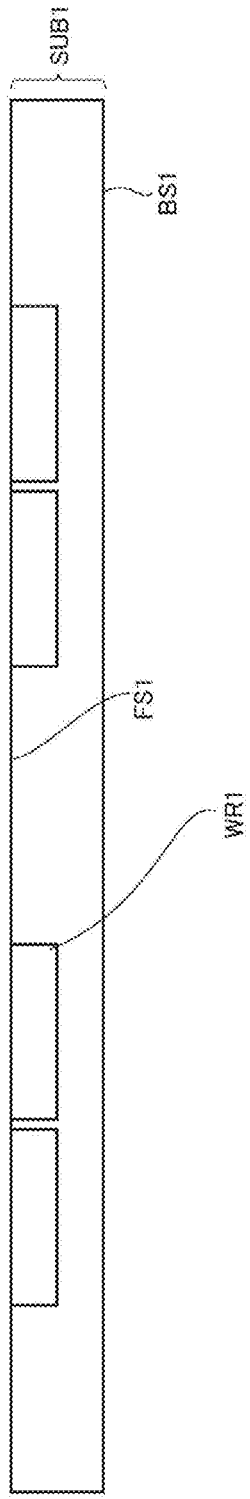
FIG. 8 is a cross-sectional view of a first semiconductor chip CHP1 of a semiconductor device according to a first embodiment in a first ion implantation step S11.
Figure 9:
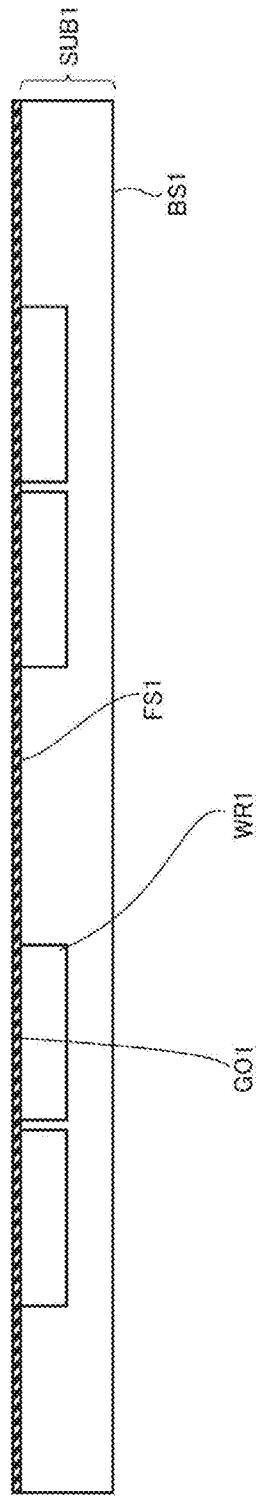
FIG. 9 is a cross-sectional view of a first semiconductor chip CHP1 of a semiconductor device according to a first embodiment in a gate dielectric film forming step S12.

As shown in FIG. 8, in the first ion implantation step S11, the well region WR1 is formed. The well region WR1 is formed by, for example, ion implantation. As shown in FIG. 9, in the gate insulating film forming step S12, the gate insulating film GO1 is formed. The gate insulating film GO1 is formed by, for example, thermal oxidation.

Figure 10:
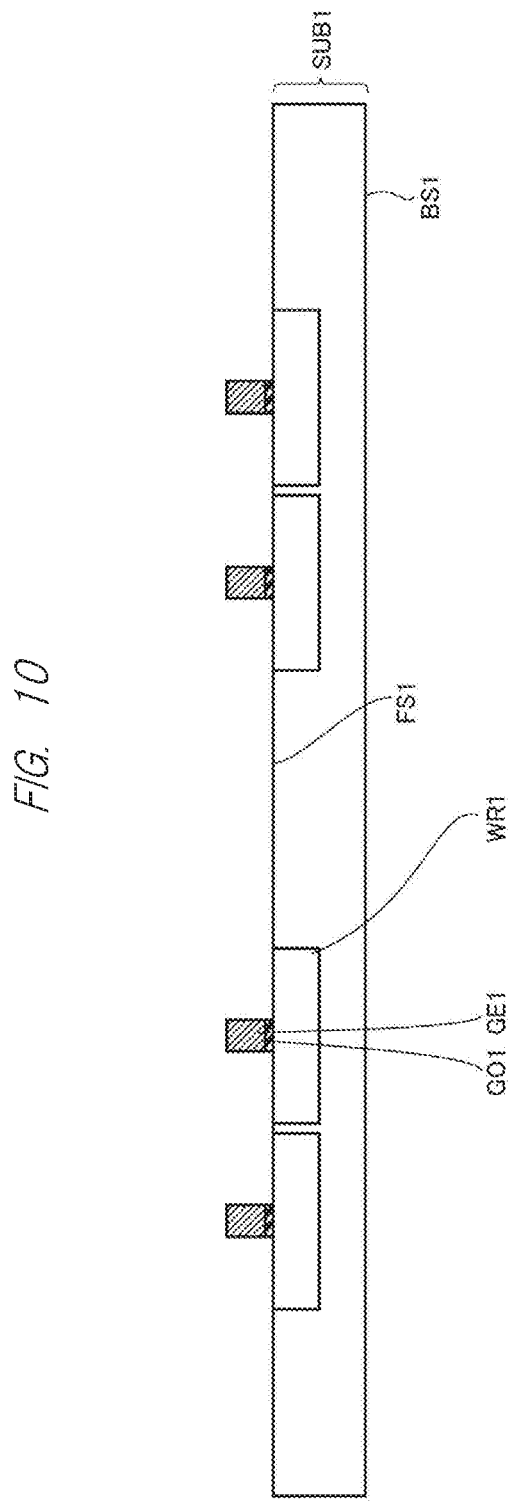
FIG. 10 is a cross-sectional view of a first semiconductor chip CHP1 of a semiconductor device according to a first embodiment in a gate electrode forming step S13.

As shown in FIG. 10, in the gate electrode forming step S13, the gate electrode GE1 is formed. In the formation of the gate electrode GE1, firstly, a film of a material constituting the gate electrode GE1 is formed. This film formation is performed, for example, by Chemical Vapor Deposition (CVD). In the formation of the gate electrode GE1, second, patterning of the material constituting the deposited gate electrode GE1 is performed. The patterning is performed by patterning the photoresist by photolithography and etching using the photoresist.

Figure 11:
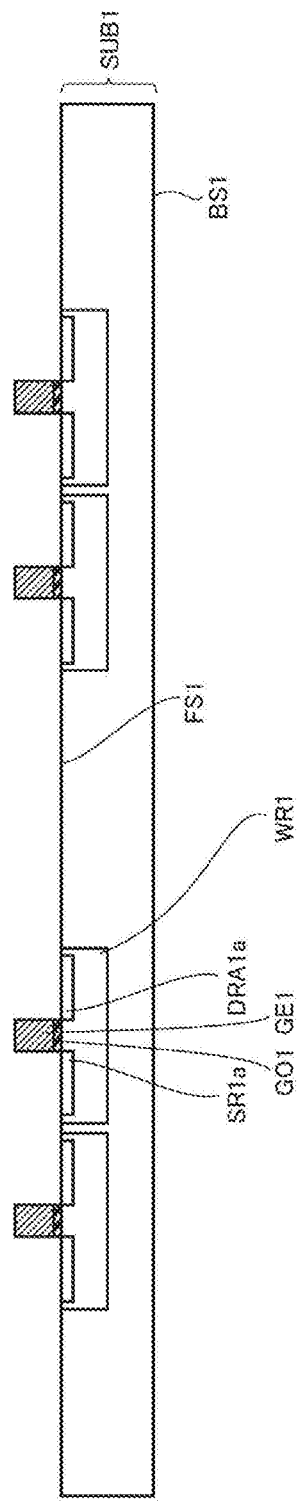
FIG. 11 is a cross-sectional view of a first semiconductor chip CHP1 of a semiconductor device according to a first embodiment in a second ion implantation step S14.

As shown in FIG. 11, in the second ion implantation step S14, the first portion SR1a and the first portion DRA1a are formed. The first partial SR1a and the first partial DRA1a are formed by, for example, ion implantation using the gate electrode GE1 as a mask.

Figure 12:
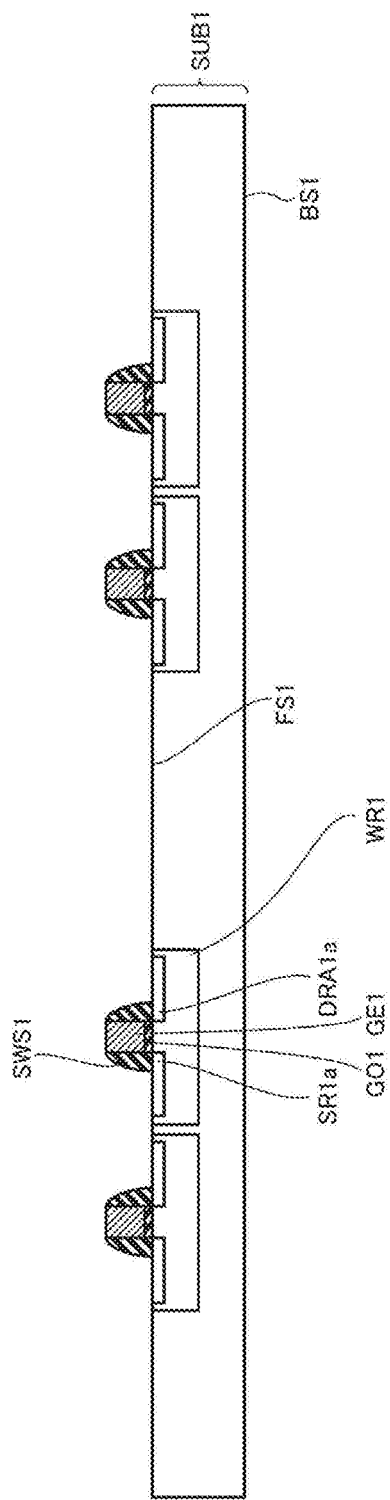
FIG. 12 is a cross-sectional view of a first semiconductor chip CHP1 of a semiconductor device according to a first embodiment in a sidewall spacer forming step S15.

As shown in FIG. 12, in the sidewall spacer forming step S15, a sidewall spacer SWS1 is formed. The sidewall spacer SWS1 is formed by depositing a material constituting the sidewall spacer SWS1 by CVD or the like and etching back the material constituting the deposited sidewall spacer SWS1.

Figure 13:
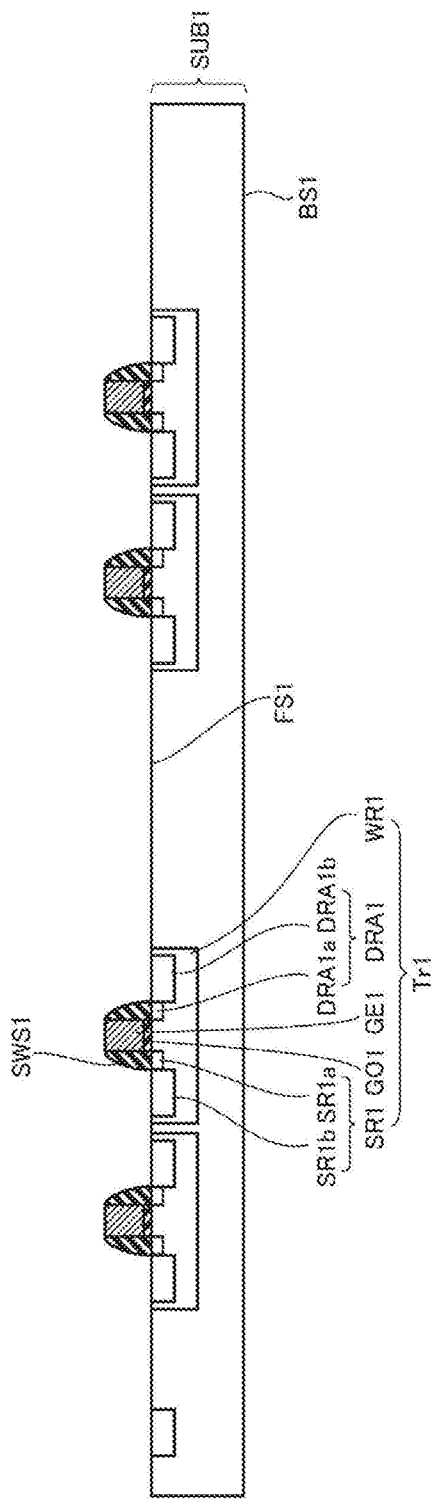
FIG. 13 is a cross-sectional view of a CHP1 of a first semiconductor chip of a semiconductor device according to a first embodiment in a third ion implantation step S16.

As shown in FIG. 13, in the third ion implantation step S16, the second portion SR1b and the second portion DRA1b are formed. The second portion SR1b and the second portion DRA1b are formed by, for example, ion implantation using the gate electrodes GE1 and the sidewall spacers SWS1 as masks.

In the wiring layer forming step S17, the first wiring layer WL1 is formed. In forming the first wiring layer WL1, first, an interlayer insulating film ILD1 is formed on the front face FS1. The interlayer insulating film ILD1 is formed by forming a material constituting the interlayer insulating film ILD1 by CVD or the like, and planarizing a material constituting the interlayer insulating film ILD1 formed by CMP (Chemical Mechanical Polishing) or the like.

In the formation of the first wiring layer WL1, second, the contact plug CP1 is formed. The contact plug CP1 is formed by forming a contact hole in the interlayer insulating film ILD1 by anisotropic etching such as Reactive Ion Etching (RIE), filling a material constituting the contact plug CP1 in the contact hole by CVD, and then removing an excess material outside the contact hole by CMP.

Third, in forming the first interconnection layer WL1, the interlayer insulating film ILD1 is formed again. The interlayer insulating film ILD1 is formed as described above.

In the formation of the first wiring layers WL1, fourth, the wiring WL1a is formed. The wiring WL1a is formed by forming the wiring trench in the interlayer insulating film ILD1, filling the wiring trench with the material constituting the wiring WL1a by CVD, and then removing the excess material outside the wiring trench by CMP. That is, the wiring WL1a is formed by a single damascene method.

In the formation of the first wiring layer WL 1, fifth, the formation of the interlayer insulating film ILD1 is performed again. The interlayer insulating film ILD1 is formed as described above.

In forming the first wiring layers WL 1, the wiring WL1a is formed sixth. At this time, the via plug VP1 is also formed.

The wiring WL1a and the via plug VP1 are formed by forming the via hole and the wiring groove in the interlayer insulating film ILD1 by anisotropic etching such as RIE, and filling the via hole and the wiring groove with a material constituting the wiring WL1a (a material constituting the via plug VP1). The wiring WL1a and the via plug VP1 may be formed by a dual damascene method or a single damascene method.

By repeating the fifth step and the sixth step of the wiring layer forming step S17, the first wiring layer WL1 is formed, and the first semiconductor chip CHP1 having the structure shown in FIG. 3 is manufactured. In the process of repeating the fifth step and the sixth step of the wiring layer forming step S17, the first inductor ID1 and the first electrode pad PD1 are also formed. Note that the back surface BS1 of the first semiconductor substrate SUB1 may be polished after the wiring layer forming step S17 and before the semiconductor chip laminating step S3 is performed.

Figure 14:
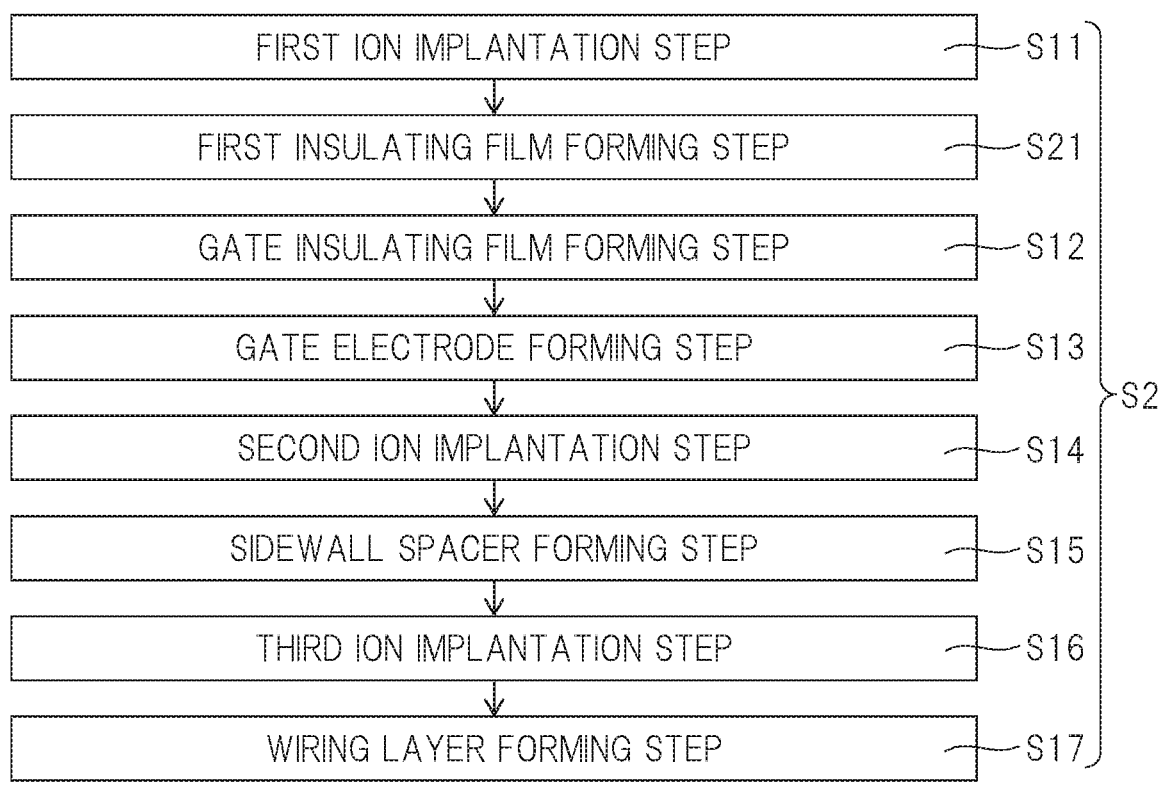
FIG. 14 is a process diagram illustrating a detail of a second semiconductor chip manufacturing step S2 in a method of manufacturing a semiconductor device according to a first embodiment.

As shown in FIG. 14, the second semiconductor chip manufacturing step S2 includes a first ion implantation step S11, a gate insulating film forming step S12, a gate electrode forming step S13, a second ion implantation step S14, a sidewall spacer forming step S15, a third ion implantation step S16, and a wiring layer forming step S17. In this regard, the second semiconductor chip manufacturing step S2 is common to the first semiconductor chip manufacturing step S1.

However, the second semiconductor chip manufacturing step S2 differs from the first semiconductor chip manufacturing step S1 in that it further comprises the first insulation film forming step S21. The first insulating film forming step S21 is performed after the first ion implantation step S11 and before the gate insulating film forming step S12.

Figure 15:
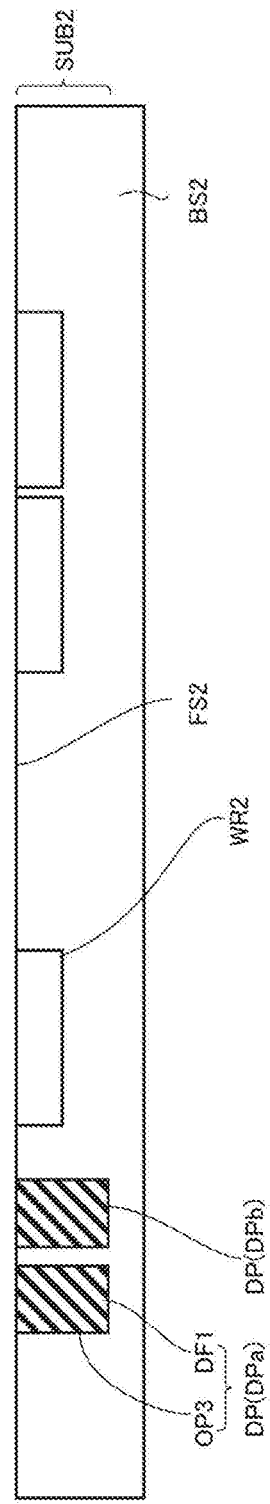
FIG. 15 is a cross-sectional view illustrating a second semiconductor chip CHP2 of a semiconductor device according to the first embodiment in the first insulating film forming step S21.

As shown in FIG. 15, in the first insulating film forming step S21, the first insulating film DF1 is formed. In the formation of the first insulating film DF1, first, an opening OP3 is formed in the surface FS2. The opening OP3 is formed by anisotropic etching such as RIE, for example. In the formation of the first insulating film DF1, second, after the material constituting the first insulating film DF1 is embedded in the opening OP3 by CVD, the excess material outside the opening OP3 is removed by CMP.

In the second semiconductor chip manufacturing step S2, the back surface BS2 of the second semiconductor substrate SUB2 may be polished after the wiring layer forming step S17 is performed. The polishing is preferably performed until the bottom surface of the first insulating film DF1 is exposed from the back surface BS2.

Figure 16:
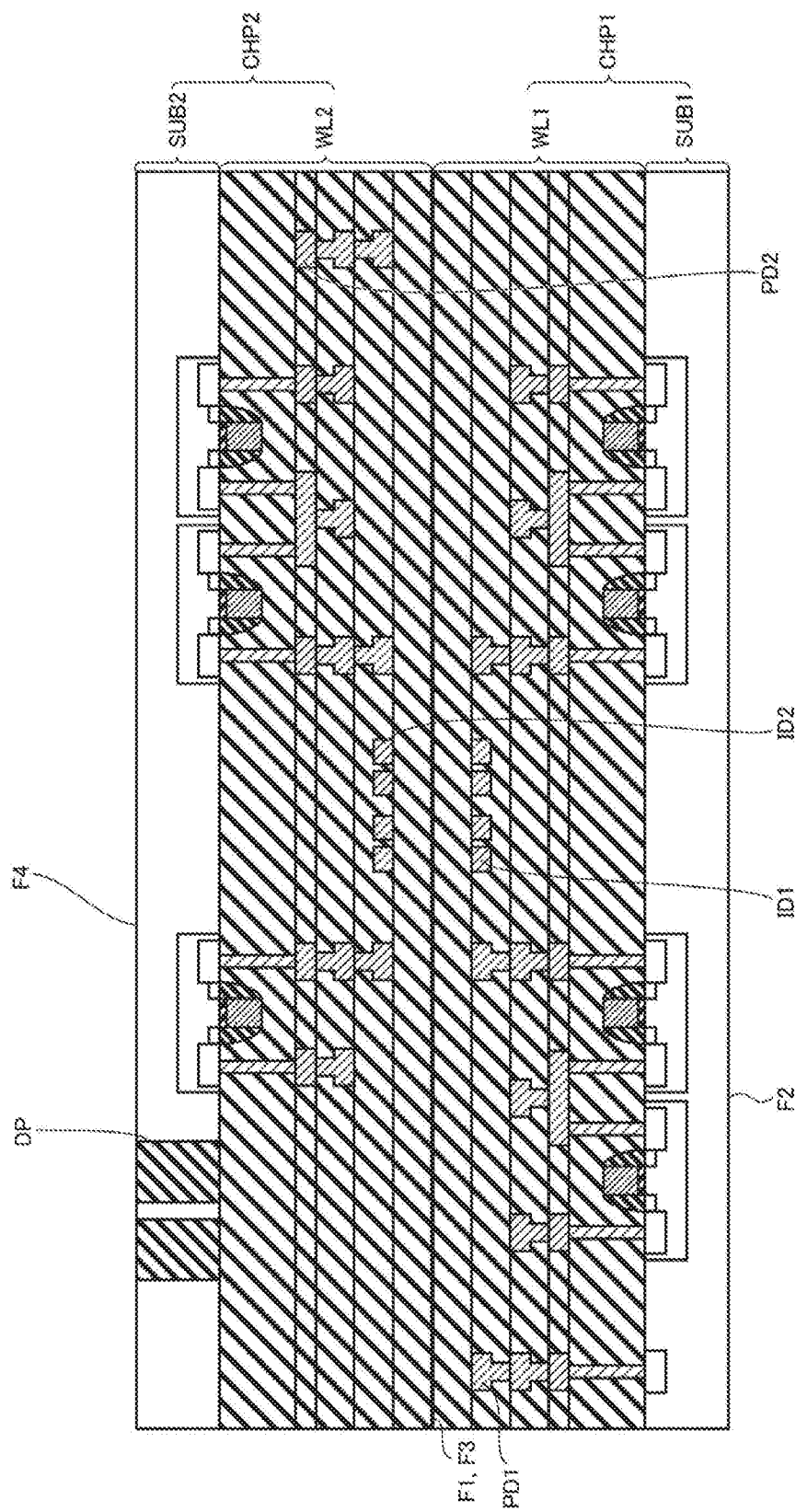
FIG. 16 is a cross-sectional view of a semiconductor device according to a first embodiment in a semiconductor chip laminating step S3.

As shown in FIG. 16, in the semiconductor chip laminating step S3, the first surface F1 of the first semiconductor chip CHP1 and the third surface F3 of the second semiconductor chip CHP2 are laminated (the first wiring layer WL1 and the second wiring layer WL2). This laminating is performed, for example, by cleaning the first surface F1 and the third surface F3 by plasma treatment or the like, and by heating the first semiconductor chip CHP1 and the second semiconductor chip CHP2 while the first surface F1 and the third surface F3 are in contact with each other.

Figure 17:
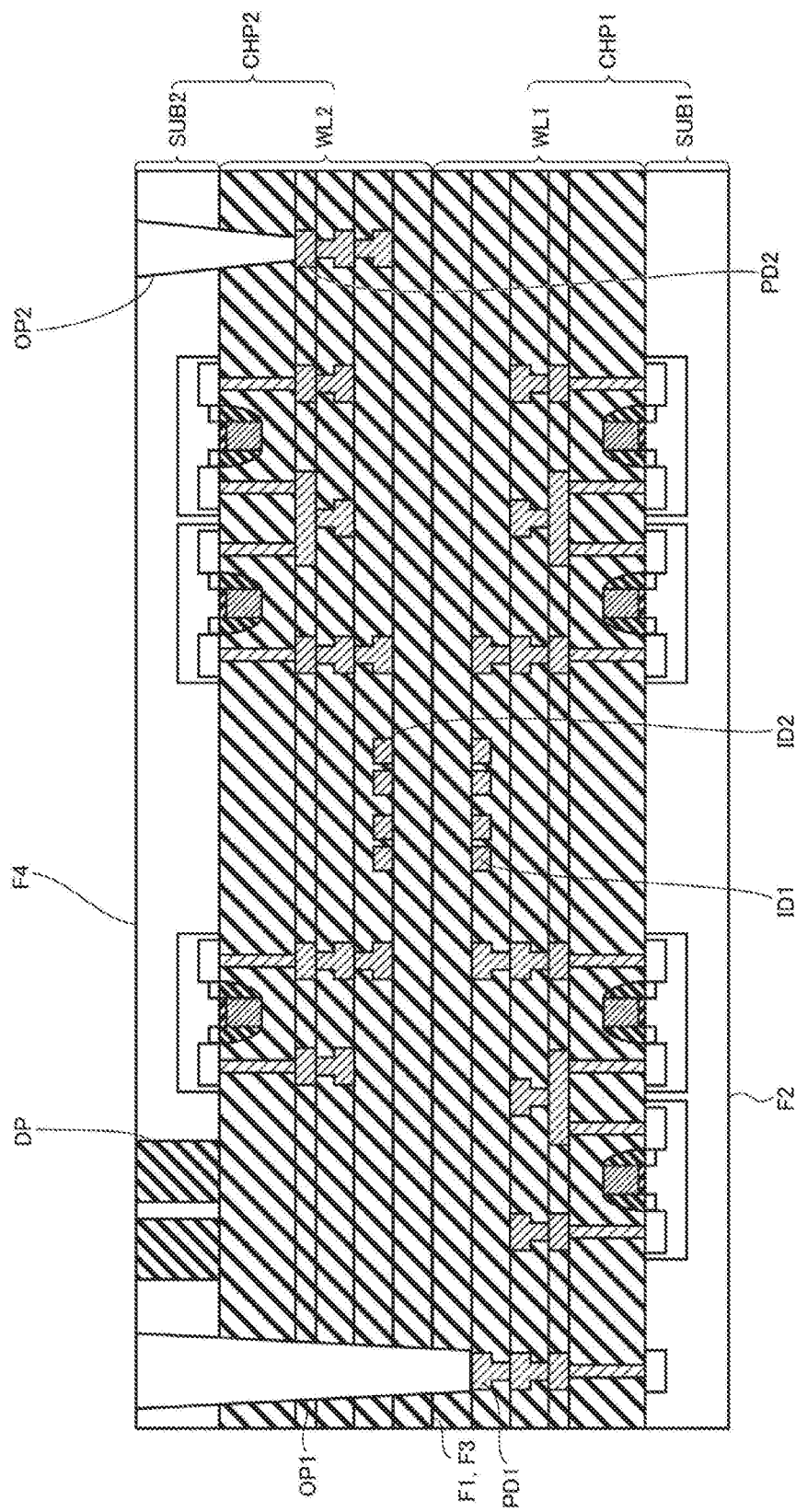
FIG. 17 is a cross-sectional view of a semiconductor device according to a first embodiment in an opening forming step S4.

As shown in FIG. 17, in the opening forming step S4, the openings OP1 and OP2 are formed. The openings OP1 and OP2 are formed by anisotropic etching such as RIE.

Figure 18:
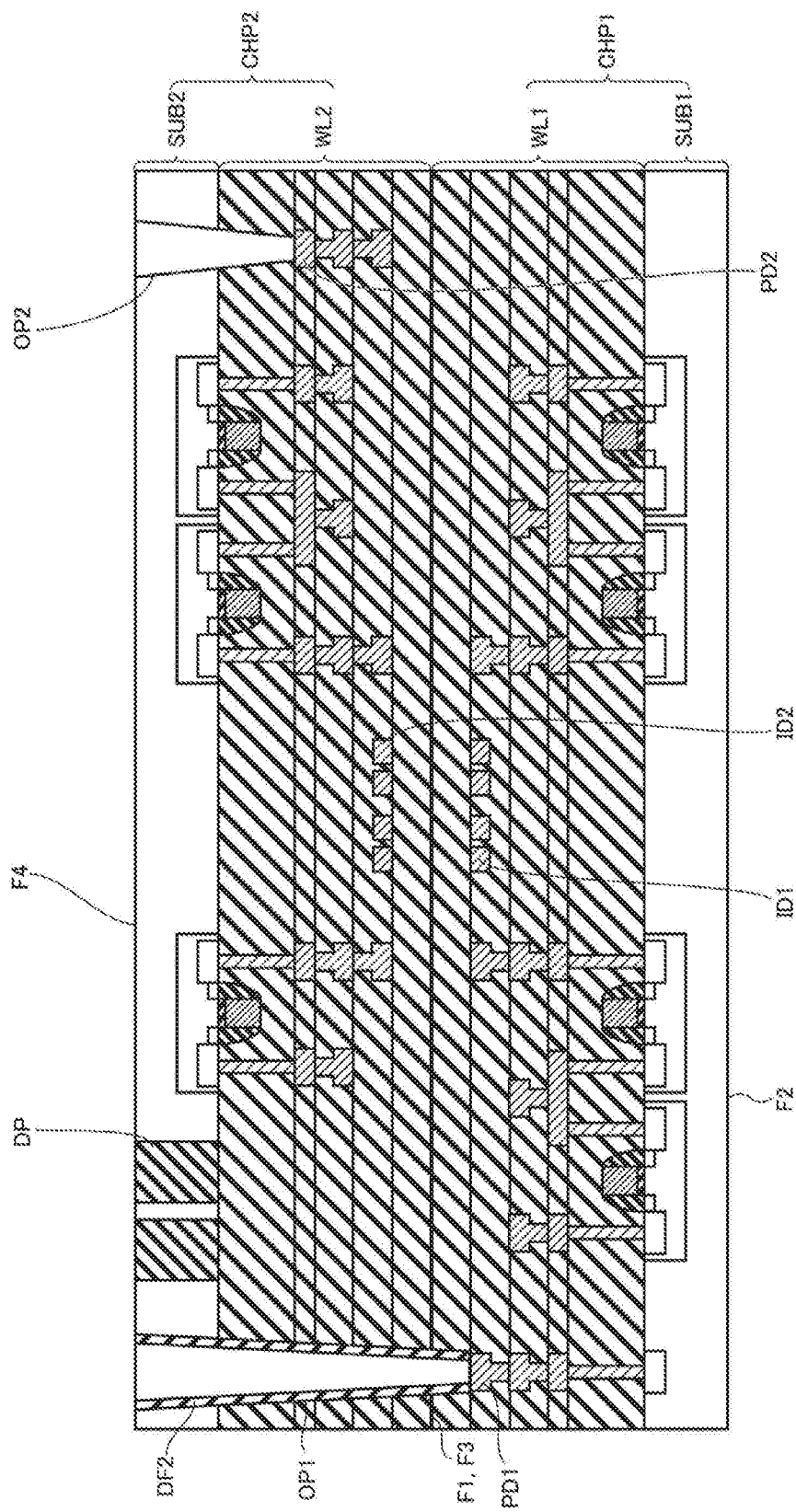
FIG. 18 is a cross-sectional view of a semiconductor device according to a first embodiment in a second insulating film forming step S5.

As shown in FIG. 18, in the second insulating film forming step S5, the second insulating film DF2 is formed. The second insulating film DF2 is formed by forming a material constituting the second insulating film DF2 by CVD or the like and etching back the formed material constituting the second insulating film DF2.

Figure 19:
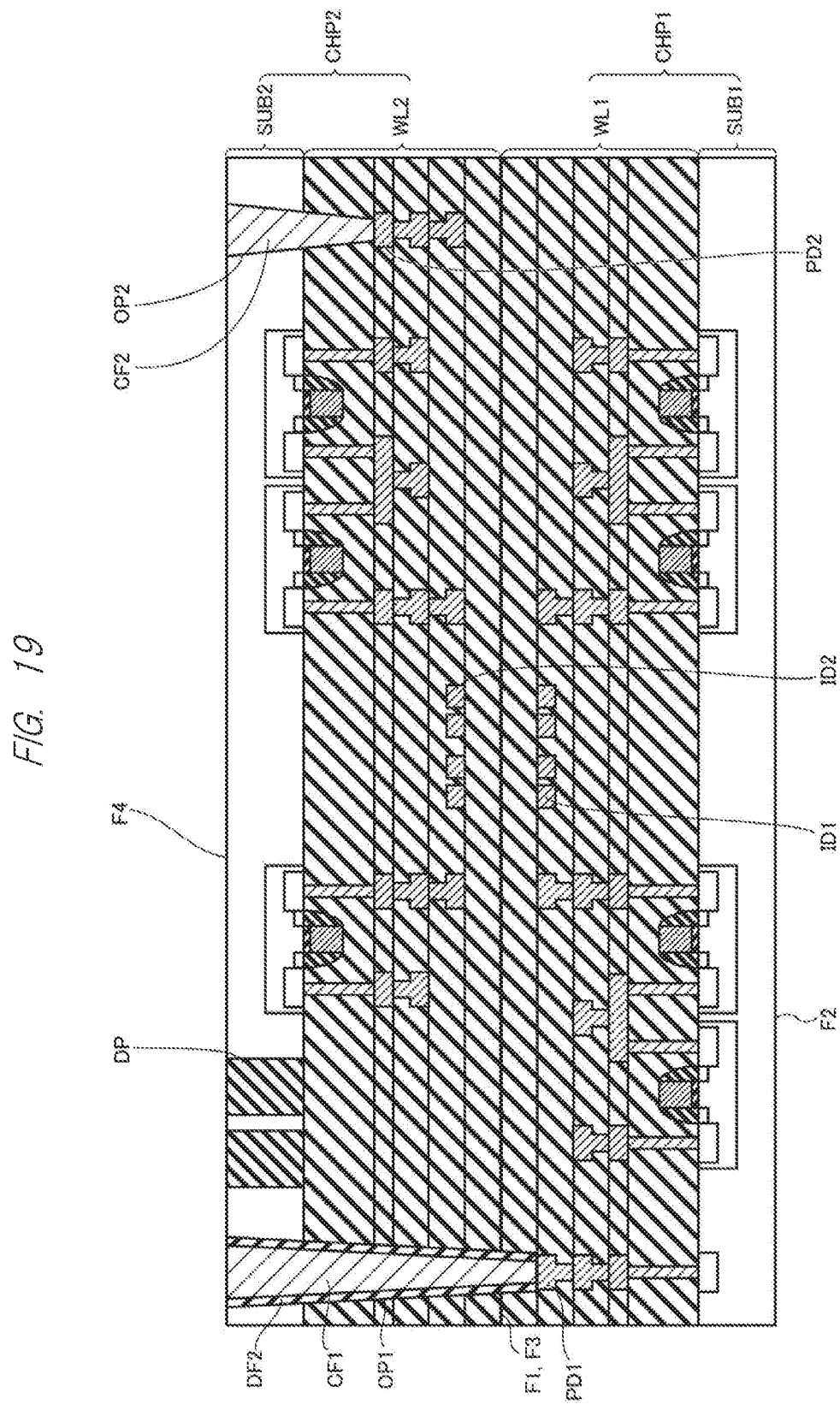
FIG. 19 is a cross-sectional view of a semiconductor device according to a first embodiment in a conductive film forming step S6.

As shown in FIG. 19, in the conductive film forming step S6, the first conductive film CF1 and the second conductive film CF2 are formed in the opening OP1 and the opening OP2, respectively. In the formation of the first conductive film CF1 and the second conductive film CF2, first, a material constituting the first conductive film CF1 and the second conductive film CF2 is buried in the opening OP1 and the opening OP2 by CVD or the like.

In the formation of the first conductive film CF1 and the second conductive film CF2, second, the materials constituting the first conductive film CF1 and the second conductive film CF2 protruding from the opening OP1 and the opening OP2 are removed by CMP or the like.

Figure 20:
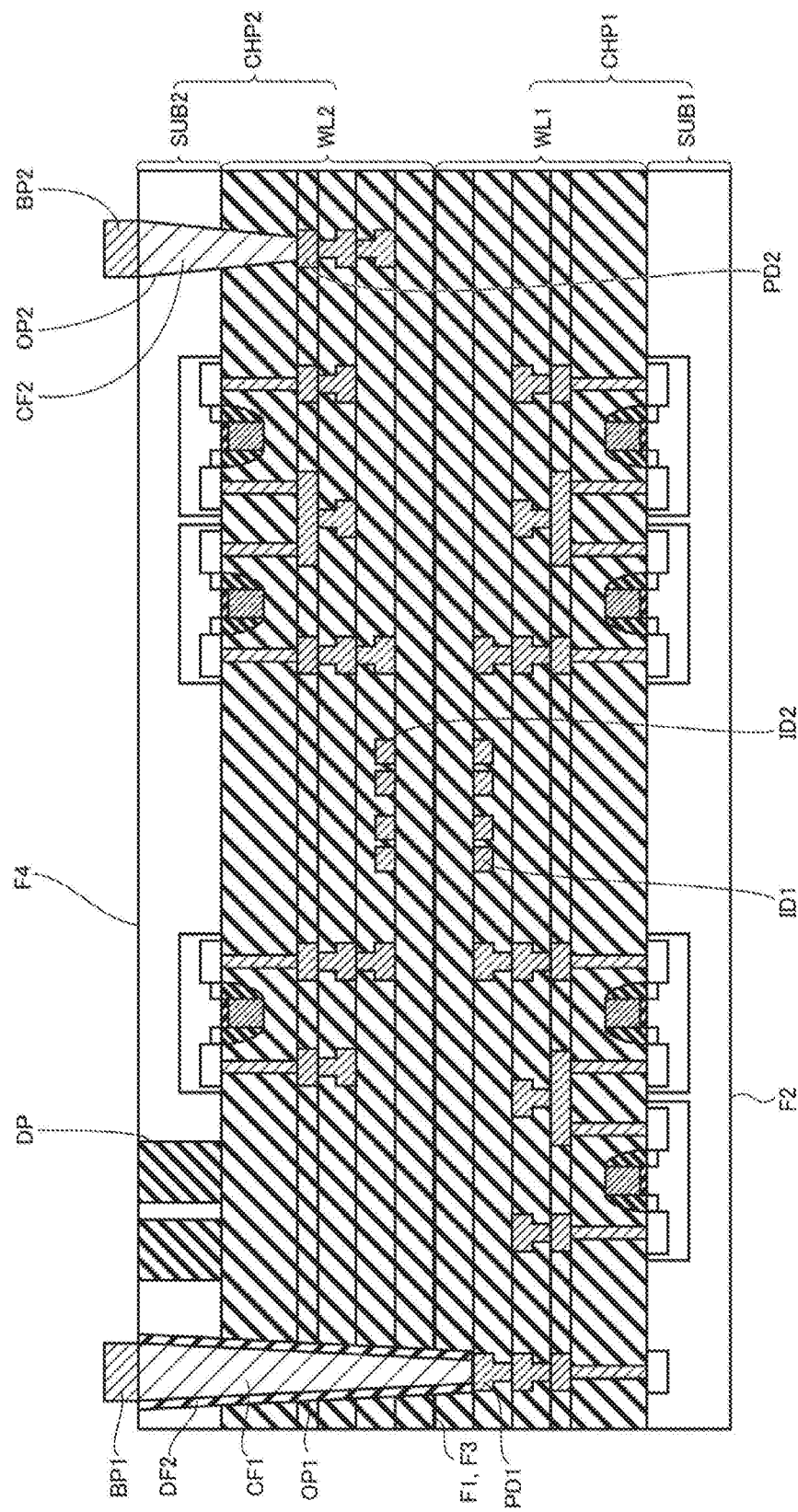
FIG. 20 is a cross-sectional view of a semiconductor device according to a first embodiment in a bonding pad forming step S7.

As shown in FIG. 20, in the bonding pad forming step S7, the first bonding pad BP1 and the second bonding pad BP2 are formed. In the formation of the first bonding pad BP1 and the second bonding pad BP2, first, a material constituting the first bonding pad BP1 and the second bonding pad BP2 is formed by sputtering or the like. In the formation of the first bonding pad BP1 and the second bonding pad BP2, second, a material constituting the deposited first bonding pad BP1 and the second bonding pad BP2 is etched using a photoresist patterned by photolithography.

In the passivation film forming step S8, the passivation film PV is formed. The passivation film PV is formed by depositing a material constituting the passivation film PV by CVD or the like, and etching the material constituting the deposited passivation film PV using a photoresist patterned by photolithography. As described above, the semiconductor device according to the first embodiment having the structure shown in FIG. 2 is manufactured.

(Effects of the Semiconductor Device According to the First Embodiment)

Hereinafter, effects of the semiconductor device according to the first embodiment will be described.

In the semiconductor device according to the first embodiment, the first conductive portion CNP1 is formed such that the first conductive portion CNP1 reaches the first electrode pad PD1 from the fourth surface F4 (the back surface BS2), and the second conductive portion CNP2 is formed such that the second conductive portion CNP2 reaches the fourth surface F4 (the back surface BS2). Therefore, the first bonding pad BP1 for connection with the first semiconductor chip CHP1 and the second bonding pad BP2 for connection with the second semiconductor chip CHP2 can be disposed on the same side (the fourth surface F4 (the back surface BS2) side). As a result, in the semiconductor device according to the first embodiment, connection to the outside of the semiconductor device can be performed using general wire bonding or the like. That is, according to the semiconductor device of the first embodiment, the assembly process can be simplified.

The first semiconductor chip CHP1 is a semiconductor chip that operates at relatively high voltages. Therefore, a relatively high voltage is applied to the first conductive film CF1. If the dielectric breakdown voltage between the first conductive film, CF1 and the impurity diffusion region constituting the transistor Tr2 is lower than the dielectric breakdown voltage between the first inductor ID1 and the second inductor ID2, dielectric breakdown may occur between the first conductive film CF1 and the impurity diffusion region constituting the transistor Tr2 in the operating state in which the potential difference between the first inductor ID1 and the second inductor ID2 is large.

In the semiconductor device according to the first embodiment, when the width of the insulating portion DP is equal to or greater than the distance between the first inductor ID1 and the second inductor ID2 (the total of the thickness T1 and the thickness T2), the dielectric breakdown voltage between the first conductive film CF1 and the impurity diffusion region constituting the transistor Tr2 is greater than the dielectric breakdown voltage between the first inductor ID1 and the second inductor ID2. Therefore, in this case, it is possible to prevent insulation breakdown between the first conductive film CF1 and the impurity diffusion region constituting the transistor Tr2 in the operation state in which the potential difference between the first inductor ID1 and the second inductor ID2 is large.

Even when the first insulating film DF1 is not formed on the second semiconductor substrate SUB2, the dielectric breakdown voltage of the semiconductor device can be secured in a similar manner as long as the thickness T3 is equal to or greater than the distance between the first inductor ID1 and the second inductor ID2 (the sum of the thickness T1 and the thickness T2).

In the semiconductor device according to the first embodiment, when the number of insulating portions DP is plural (2 or more or 4 or more), the dielectric breakdown voltage of the semiconductor device can be ensured even if the width of each insulating portion DP is relatively small. As the widths of the insulating portions LPs become smaller, warpage of the second semiconductor substrate SUB2 can be reduced.

(The Configuration of the Semiconductor Device According to the Second Embodiment)

The configuration of the semiconductor device according to the second embodiment will be described below. It should be noted that points different from the configuration of the semiconductor device according to the first embodiment will be mainly described, and description thereof will not be repeated.

Figure 21:
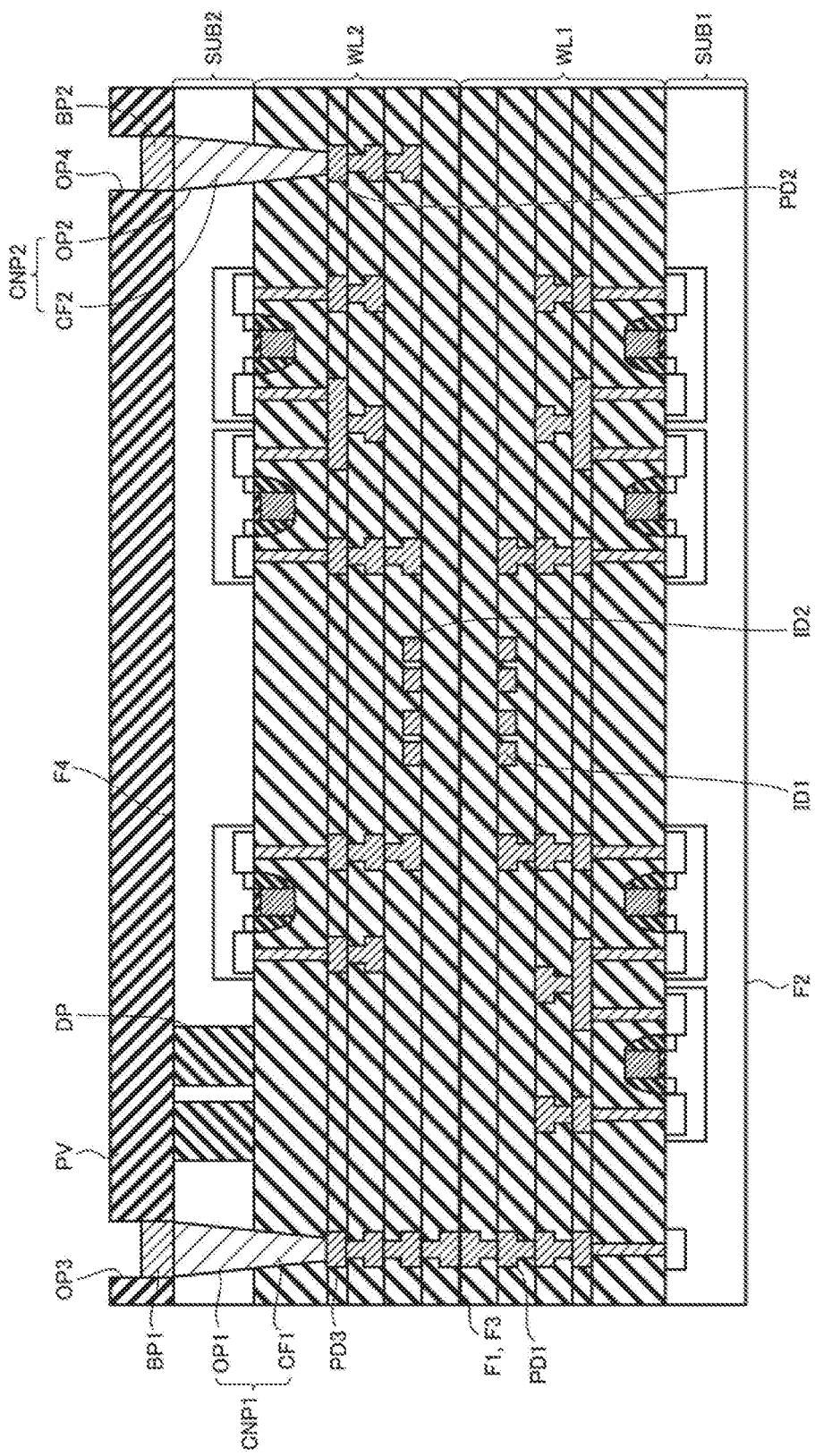
FIG. 21 is a cross-sectional view of a semiconductor device according to a second embodiment.

As shown in FIG. 21, the semiconductor device according to the second embodiment includes a first semiconductor chip CHP1, a second semiconductor chip CHP2, a first conductive portion CNP1, and a second conductive portion CNP2. The first semiconductor chips CHP1 include first semiconductor substrates SUB1 and first wiring layers WL1. The first wiring layer WL1 includes a first electrode pad PD1 and a first inductor ID1. The second semiconductor chips CHP2 include a second semiconductor substrates SUB2, a second wiring layers WL2, and an insulating portions DP. The second wiring layer WL2 has a second electrode pad PD2 and a second inductor ID2. In these respects, the configuration of the semiconductor device according to the second embodiment is common to the configuration of the semiconductor device according to the first embodiment.

However, the configuration of the semiconductor device according to the second embodiment is different from the configuration of the semiconductor device according to the first embodiment in that the second wiring layer WL2 further includes the third electrode pad PD3. The configuration of the semiconductor device according to the second embodiment differs from the configuration of the semiconductor device according to the first embodiment with respect to the detail of the first conductive portion CNP1 and the first electrode pad PD1.

Figure 22:
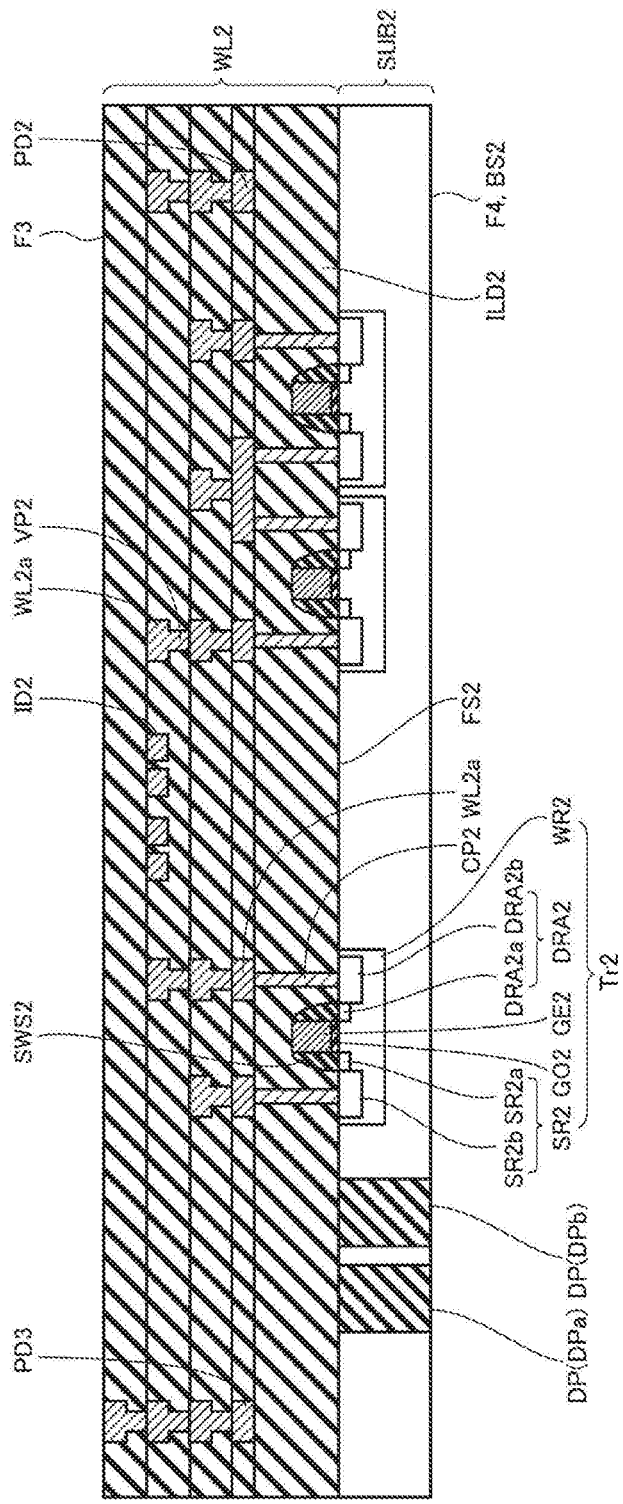
FIG. 22 is a cross-sectional view of a second semiconductor chip CHP2 of a semiconductor device according to a second embodiment.
Figure 23:
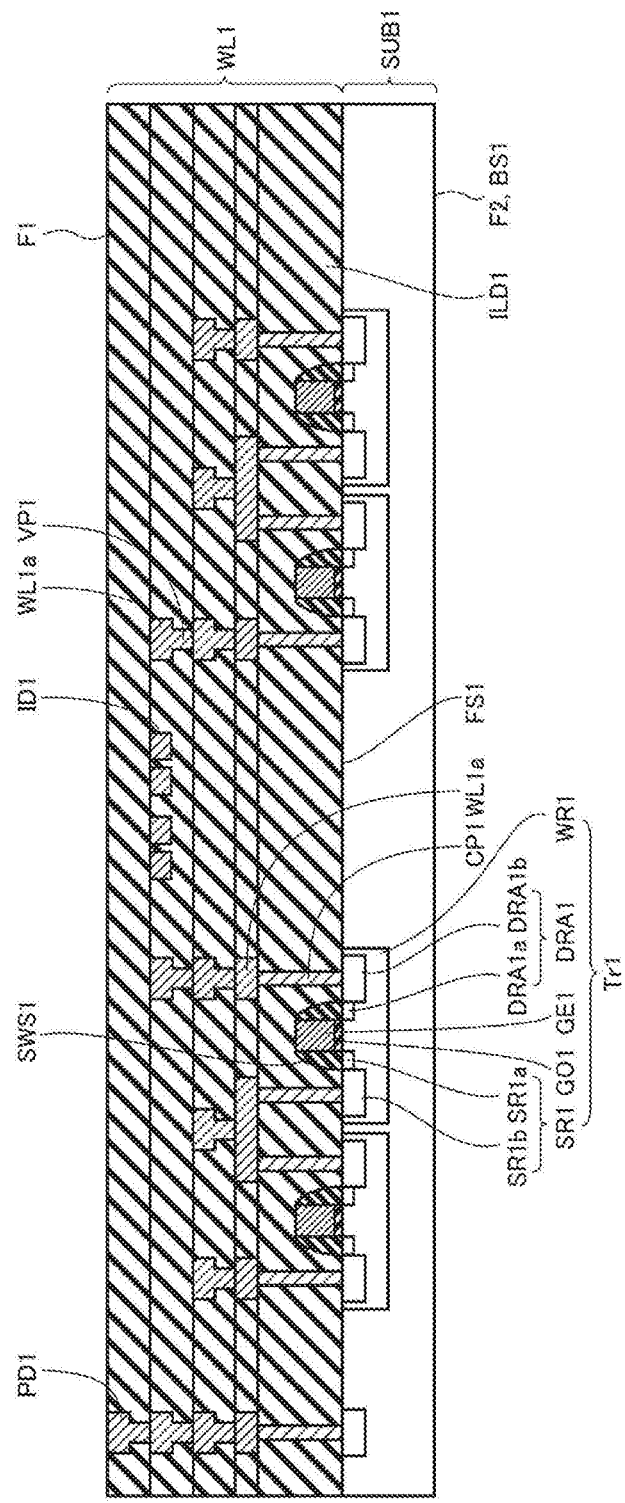
FIG. 23 is a cross-sectional view of a first semiconductor chip CHP1 of a semiconductor device according to a second embodiment.

As shown in FIG. 22, the third electrode pad PD3 is formed in the second wiring layer WL2. The third electrode pad PD3 is electrically connected with the wiring WL2a and the via plug VP2, which are connected with each other along a direction intersecting with the front surface FS2, for example, the third surface F3 and the fourth surface F4. An upper surface of the third electrode pad PD3 constitutes a part of the third surface F3. As shown in FIG. 23, an upper surface of the first electrode pad PD1 constitutes a part of the first surface F1.

As shown in FIG. 21, the first electrode pad PD1 and the third electrode pad PD3 are disposed such that the first electrode pad PD1 and the third electrode pad PD3 face with each other in a state in which the first surface F1 and the third surface F3 are laminated to each other. As a result, the first electrode pad PD1 and the third electrode pad PD3 are electrically laminated with each other in a state in which the first surface F1 and the third surface F3 are laminated with each other.

The first conductive portion CNP1 is formed on the second semiconductor substrate SUB2 and the second interconnect layer WL2 such that the first conductive portion CNP1 extends from the fourth surface F4 to the third electrode pad PD3. The opening OP1 is formed in the second semiconductor substrate SUB2 and the second wiring layer WL2 such that the opening OP1 reaches the third electrode pad PD3 from the fourth surface F4. More specifically, the opening OP1 passes through the second semiconductor substrate SUB2 and is formed in the second wiring layer WL2 to reach the third electrode pad PD3.

(Method of Manufacturing a Semiconductor Device According to the Second Embodiment)

The method of manufacturing a semiconductor device according to the second embodiment will be described below. It should be noted that differences from the manufacturing method of the semiconductor device according to the first embodiment will be mainly described, and description thereof will not be repeated.

The method of manufacturing a semiconductor device according to the second embodiment includes a first semiconductor chip manufacturing step S1, a second semiconductor chip manufacturing step S2, a semiconductor chip bonding step S3, an opening forming step S4, a second insulating film forming step S5, a conductive film forming step S6, a bonding pad forming step S7, and a passivation film forming step S8.

The first semiconductor chip manufacturing step S1 includes a first ion implantation step S11, a gate insulating film forming step S12, a gate electrode forming step S13, a second ion implantation step S14, a sidewall spacer forming step S15, a third ion implantation step S16, and a wiring layer forming step S17. The second semiconductor chip manufacturing step S2 includes a first ion implantation step S11, a gate insulating film forming step S12, a gate electrode forming step S13, a second ion implantation step S14, a sidewall spacer forming step S15, a third ion implantation step S16, a wiring layer forming step S17, and a first insulating film forming step S21. In these respects, the manufacturing method of the semiconductor device according to the second embodiment is common to the manufacturing method of the semiconductor device according to the first embodiment.

However, in the manufacturing method of the semiconductor device according to the second embodiment, in the wiring layer forming step S17 of the first semiconductor chip manufacturing step S1, the first electrode pad PD1 is formed so that the upper surface of the first electrode pad PD1 is positioned on the first surface F1. In the method of manufacturing a semiconductor device according to the second embodiment, the third electrode pad PD3 is formed in the wiring layer forming step S17 of the second semiconductor chip manufacturing step S2. In these respects, the manufacturing method of the semiconductor device according to the second embodiment is different from the manufacturing method of the semiconductor device according to the first embodiment.

(Effects of the Semiconductor Device According to the Second Embodiment)

Hereinafter, effects of the semiconductor device according to the second embodiment will be described. It should be noted that points different from the effects of the semiconductor device according to the first embodiment will be mainly described, and description thereof will not be repeated.

As described above, the opening OP1 of the semiconductor device according to the second embodiment is relatively shallow compared to the opening OP1 of the semiconductor device according to the first embodiment. As the opening OP1 is deeper, the etching species hardly reach the bottom of the opening OP1, and it is more difficult to form the opening OP1. Therefore, according to the semiconductor device of the second embodiment, it is possible to facilitate the formation of the opening OP1.

Although the invention made by the present inventor has been specifically described based on the embodiments, the present invention is not limited to the embodiments described above, and it is needless to say that various modifications can be made without departing from the gist thereof.

What is claimed is:

1. A semiconductor device comprising:
   a first semiconductor substrate having a first front surface and a first back surface opposite the first front surface;
   a first wiring layer formed on the first front surface of the first semiconductor substrate, the first wiring layer comprising a first electrode pad and a first inductor electrically connected with each other;
   a second wiring layer formed on the first wiring layer, the second wiring layer comprising a second electrode pad and a second inductor electrically connected with each other, the first inductor and the second inductor facing each other;
   a second semiconductor substrate formed on the second wiring layer, the second semiconductor having a second front surface and a second back surface opposite to the second front surface, the second wiring layer being formed on the second front surface of the second semiconductor substrate;
   a first conductive portion extending from the second back surface of the second semiconductor substrate to the first electrode pad of the of the first wiring layer such that the first conductive portion penetrates through the second semiconductor substrate and the second wiring layer; and
   a second conductive portion extending from the second back surface of the second semiconductor substrate to the second electrode pad of the second wiring layer such that the second conductive portion penetrates through the second semiconductor substrate to the second wiring layer,
   wherein the second conductive portion directly contacts the second semiconductor substrate.

2. The semiconductor device according to claim 1,
   wherein an impurity diffusion region constituting a semiconductor element and a first insulating portion isolating the impurity diffusion region from the first conductive portion are formed in the second semiconductor substrate, and wherein a width of the first insulating portion is equal to or greater than a distance between the first and second inductors.

3. The semiconductor device according to claim 2, wherein a number of the first insulating portion is 2 or more.

4. The semiconductor device according to claim 3, wherein a number of the first insulating portion is 4 or more.

5. The semiconductor device according to claim 2,
wherein the first inductor has a spiral shape in plan view, and
wherein the second inductor has a spiral shape in plan view.

6. The semiconductor device according to claim 1,
wherein the first conductive portion comprising:
a first opening formed in the second semiconductor substrate, the second wiring layer and the first wiring layer such that the first opening reaches the first electrode pad from the back surface of the second semiconductor substrate;
an insulating film formed such that the insulating film covers an inner side surface of the first opening; and
a first conductive film formed on the insulating film such that the first opening is buried with the first conductive film, and
wherein a thickness of the insulating film is equal to or greater than a distance between the first and second inductors.

7. The semiconductor device according to claim 1, wherein the first conductive portion and the second conductive portion are electrically insulated with each other.

8. A semiconductor device comprising:
a first semiconductor substrate having a first front surface and a first back surface opposite the first front surface;
a first wiring layer formed on the first front surface of the first semiconductor substrate, the first wiring layer comprising a first electrode pad and a first inductor electrically connected with each other;
a second wiring layer formed on the first wiring layer, the second wiring layer comprising a second electrode pad and a second inductor electrically connected with each other and a third electrode pad electrically connected with the first electrode pad, the first inductor and the second inductor facing each other;
a second semiconductor substrate formed on the second wiring layer, the second semiconductor substrate having a second front surface and a second back surface opposite to the second front surface, the second wiring layer being formed on the second front surface of the second semiconductor substrate;
a first conductive portion extending from the second back surface of the second semiconductor substrate to the third electrode pad in the second wiring layer such that the first conductive portion penetrates through the second semiconductor substrate and the second wiring layer; and
a second conductive portion extending from the second back surface of the second semiconductor substrate to the second electrode pad of the second wiring layer such that the second conductive portion penetrates through the second semiconductor substrate to the second wiring layer,
wherein the second conductive portion directly contacts the second semiconductor substrate.

9. The semiconductor device according to claim 8, wherein an impurity diffusion region constituting a semiconductor element and a first insulating portion isolating the impurity diffusion region from the first conductive portion are formed in the second semiconductor substrate, and
wherein a width of the first insulating portion is equal to or greater than a distance between the first and second inductors.

10. The semiconductor device according to claim 9, wherein a number of the first insulating portion is 2 or more.

11. The semiconductor device according to claim 10, wherein a number of the first insulating portion is 4 or more.

12. The semiconductor device according to claim 9,
wherein the first inductor has a spiral shape in plan view, and
wherein the second inductor has a spiral shape in plan view.

13. The semiconductor device according to claim 8,
wherein the first conductive portion comprising:
a first opening formed in the second semiconductor substrate and the first wiring layer such that the first opening reaches the third electrode pad from the back surface of the second semiconductor substrate;
an insulating film formed such that the insulating film covers an inner side surface of the first opening; and
a first conductive film formed on the insulating film such that the first opening is buried with the first conductive film, and
wherein a thickness of the insulating film is equal to or greater than a distance between the first and second inductors.

14. The semiconductor device according to claim 8, wherein the first conductive portion and the second conductive portion are electrically insulated with each other.

15. The semiconductor device according to claim 8,
wherein the second electrode pad and the third electrode pad are formed in a same layer of the second wiring layer with each other, and
wherein, in a thickness direction of the second semiconductor substrate, a length of the first conductive portion is a same as a length of the second conductive portion.

16. A manufacturing method of a semiconductor device, the manufacturing method comprising:
preparing a first semiconductor chip comprising a first semiconductor substrate and a first wiring layer formed on the first semiconductor substrate, the first wiring layer comprising a first inductor and a first electrode pad electrically connected with each other;
preparing a second semiconductor chip comprising a second semiconductor substrate and a second wiring layer formed on the second semiconductor substrate, the second wiring layer comprising a second inductor and a second electrode pad electrically connected with each other;
laminating the first wiring layer and the second wiring layer with each other such that the first inductor and the second inductor face with each other; and
forming a first conductive portion and a second conductive portion,
wherein forming the first conductive portion includes:
forming a first opening in the second semiconductor substrate, the second wiring layer, and the first wiring layer such that the first opening reaches the first electrode pad from a back surface of the second semiconductor substrate;
burying the first opening with a first conductive film,
wherein forming the second conductive portion includes:
forming a second opening in the second semiconductor substrate and the second wiring layer such that the second opening reaches the second electrode pad from the back surface of the second semiconductor substrate;

burying the second opening with a second conductive film, and wherein the second conductive portion directly contacts the second semiconductor substrate.

17. The manufacturing method of the semiconductor device according to claim 16, wherein the preparing of the second semiconductor chip comprising:

forming an impurity diffusion region constituting a semiconductor element in the second semiconductor substrate;

forming a third opening in a region different from the impurity diffusion region of the second semiconductor substrate;

forming a first insulating film so as to bury the third opening; and polishing the back surface of the second semiconductor substrate so as to expose the first insulating film, and wherein a width of the first insulating film is equal to or greater than a distance between the first and second inductors.

18. The manufacturing method of the semiconductor device according to claim 17, wherein a number of the first insulating film is 2 or more.

19. The manufacturing method of the semiconductor device according to claim 18, wherein a number of the first insulating film is 4 or more.

20. The manufacturing method of the semiconductor device according to claim 16, further comprising forming a second insulating film on an inner side surface of the first opening before burying the first opening with the first conductive film, wherein a thickness of the insulating film is equal to or greater than a distance between the first and second inductors.

21. The manufacturing method of the semiconductor device according to claim 16, wherein the first wiring layer comprises a first interlayer insulating film, and wherein the second wiring layer comprises a second interlayer insulating film.

22. The manufacturing method of the semiconductor device according to claim 16, wherein the first conductive portion and the second conductive portion are electrically insulated with each other.

* * * * *